(12) United States Patent
Hettler et al.

(10) Patent No.: US 9,807,897 B2
(45) Date of Patent: Oct. 31, 2017

(54) GLASS SYSTEM FOR HERMETICALLY JOINING CU COMPONENTS, AND HOUSING FOR ELECTRONIC COMPONENTS

(75) Inventors: Robert Hettler, Kumhausen (DE); Matthias Rindt, Landshut (DE)

(73) Assignee: SCHOTT AG, Mainz (DE)

( * ) Notice: Subject to any disclaimer, the term of this patent is extended or adjusted under 35 U.S.C. 154(b) by 239 days.

(21) Appl. No.: 14/004,063

(22) PCT Filed: Mar. 5, 2012

(86) PCT No.: PCT/EP2012/000975
§ 371 (c)(1),
(2), (4) Date: Nov. 15, 2013

(87) PCT Pub. No.: WO2012/119750
PCT Pub. Date: Sep. 13, 2012

(65) Prior Publication Data
US 2014/0153165 A1    Jun. 5, 2014

(30) Foreign Application Priority Data

Mar. 7, 2011  (DE) .................. 10 2011 013 276
Mar. 7, 2011  (DE) .................. 10 2011 013 278

(51) Int. Cl.
*H05K 5/06* (2006.01)
*C03C 8/08* (2006.01)
(Continued)

(52) U.S. Cl.
CPC .............. *H05K 5/06* (2013.01); *C03C 3/064* (2013.01); *C03C 3/066* (2013.01); *C03C 8/08* (2013.01);
(Continued)

(58) Field of Classification Search
None
See application file for complete search history.

(56) References Cited

U.S. PATENT DOCUMENTS

| 4,349,635 A | 9/1982 | Davis et al. |
| 4,417,913 A | 11/1983 | Davis et al. |

(Continued)

FOREIGN PATENT DOCUMENTS

| CN | 1822401 A | 8/2006 |
| CN | 1011118942 A | 8/2007 |

(Continued)

OTHER PUBLICATIONS

International Preliminary Report on Patentability dated Sep. 19, 2013 corresponding to PCT/EP2012/000975, 5 pp.

(Continued)

*Primary Examiner* — Anthony J Frost
(74) *Attorney, Agent, or Firm* — Ohlandt, Greeley, Ruggiero & Perle, L.L.P.

(57) ABSTRACT

An housing for electronic components, such as LEDs and/or FETs, is provided. The housing has a base body having an upper surface that at least partially defines a mounting area for an electronic functional element, such that the base body provides a heat sink for the electronic functional element. The base body has a lower surface and a lateral surface and includes a connecting body for the electronic functional element, which is joined to the base body a glass layer formed by an alkali titanium silicate glass.

32 Claims, 20 Drawing Sheets

(51) Int. Cl.
*C03C 8/24* (2006.01)
*C03C 29/00* (2006.01)
*H01L 33/64* (2010.01)
*C03C 27/02* (2006.01)
*C03C 3/064* (2006.01)
*C03C 3/066* (2006.01)
*H01L 33/48* (2010.01)

(52) U.S. Cl.
CPC ............... *C03C 8/24* (2013.01); *C03C 27/02* (2013.01); *C03C 29/00* (2013.01); *H01L 33/486* (2013.01); *H01L 33/647* (2013.01); *B32B 2457/202* (2013.01); *H01L 33/483* (2013.01); *H01L 2224/48091* (2013.01); *H01L 2224/48235* (2013.01); *H01L 2224/73265* (2013.01); *H01L 2924/15153* (2013.01); *H01L 2924/3025* (2013.01)

(56) References Cited

U.S. PATENT DOCUMENTS

| | | | |
|---|---|---|---|
| 4,742,432 A | 5/1988 | Thillays et al. | |
| 5,177,034 A | 1/1993 | Jean et al. | |
| 5,321,307 A | 6/1994 | Murai | |
| 7,547,369 B2 | 6/2009 | Khadilkar et al. | |
| 2002/0103069 A1 | 8/2002 | Young | |
| 2003/0220185 A1* | 11/2003 | Sakamoto | C03C 8/14 501/136 |
| 2005/0130826 A1 | 6/2005 | Brix et al. | |
| 2006/0169999 A1* | 8/2006 | Park | H01L 33/62 257/99 |
| 2006/0245195 A1 | 11/2006 | Kim et al. | |
| 2008/0029780 A1* | 2/2008 | Ohtsuka | C03C 3/066 257/99 |
| 2008/0044488 A1* | 2/2008 | Zimmer | B82Y 30/00 424/600 |
| 2008/0096046 A1* | 4/2008 | Yamashita | C23C 8/02 428/655 |
| 2008/0261054 A1* | 10/2008 | Gadkaree | H01L 21/76254 428/426 |
| 2010/0032702 A1* | 2/2010 | Lahijani | H01L 33/60 257/98 |
| 2010/0171142 A1* | 7/2010 | Chen | H01L 33/642 257/99 |
| 2010/0237371 A1* | 9/2010 | Kang | H01L 33/44 257/98 |
| 2011/0051432 A1* | 3/2011 | Heine | F21K 9/00 362/373 |
| 2011/0108857 A1* | 5/2011 | Rindt | H01L 33/486 257/81 |
| 2011/0251044 A1* | 10/2011 | Nagai | C03B 18/18 501/70 |

FOREIGN PATENT DOCUMENTS

| | | |
|---|---|---|
| DE | 10150239 A1 | 4/2003 |
| EP | 0664585 | 7/1995 |
| GB | 1408256 | 10/1975 |
| JP | S58501767 | 10/1983 |
| JP | H10163355 A | 6/1998 |
| JP | 2004059366 A | 2/2004 |
| JP | 2006509373 A | 3/2006 |
| JP | 2006313896 A | 11/2006 |
| JP | 2008204808 | 9/2008 |
| JP | 2008288543 A | 11/2008 |
| WO | 2009/132838 | 11/2009 |
| WO | 2010013692 | 2/2010 |

OTHER PUBLICATIONS

Japanese Office Action dated Oct. 23, 2014 for corresponding Japanese Patent Application No. 2013-557002 with English translation, 8 pp.
Korean Office Action dated Dec. 19, 2014 for corresponding Korean Patent Application No. 10-2013-7022659 with English translation, 8 pp.
English translation of International Preliminary Report on Patentability dated Sep. 10, 2013 corresponding to PCT/EP2012/000975, 11 pp.
Office Action dated Dec. 9, 2011 in corresponding German Application No. 10 2011 013 276.7 with with English translation, 6 pp.
English Translation of International Search Report dated May 30, 2012 corresponding to International Patent Application No. PCT/EP2012/000975, 3 pp.
English Translation of International Written Opinion dated May 30, 2012 corresponding to International Patent Application No. PCT/EP2012/000975, 10 pp.

* cited by examiner

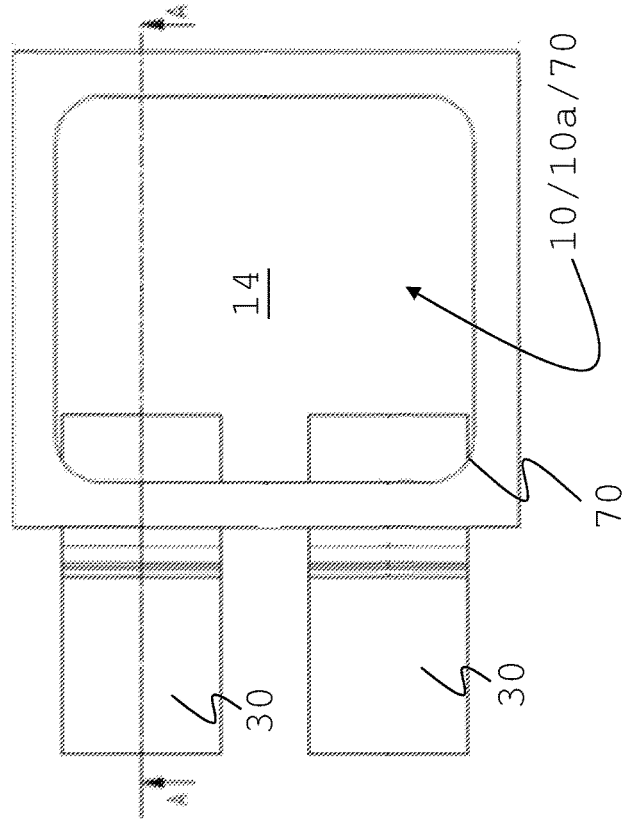
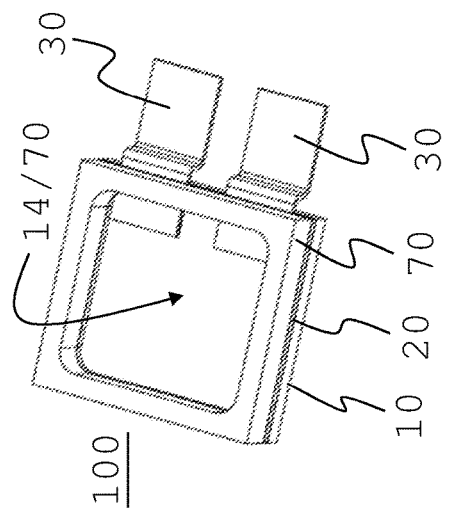

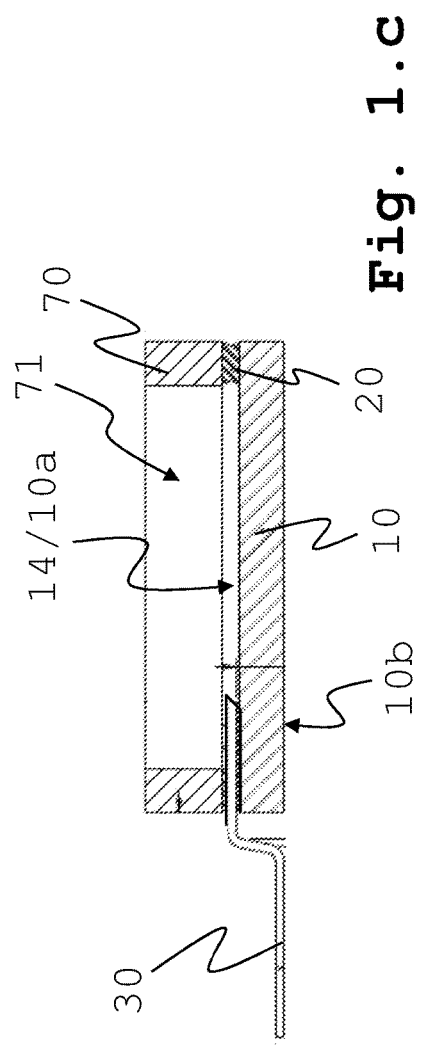
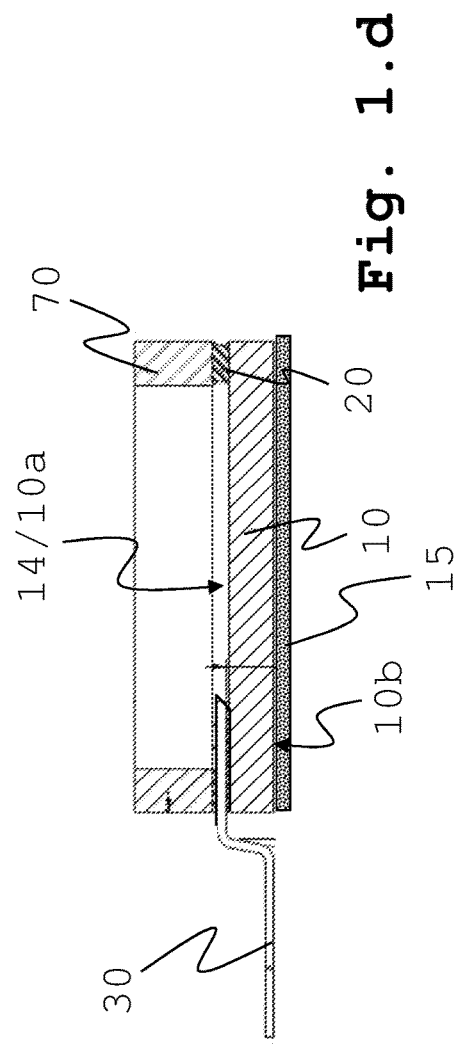

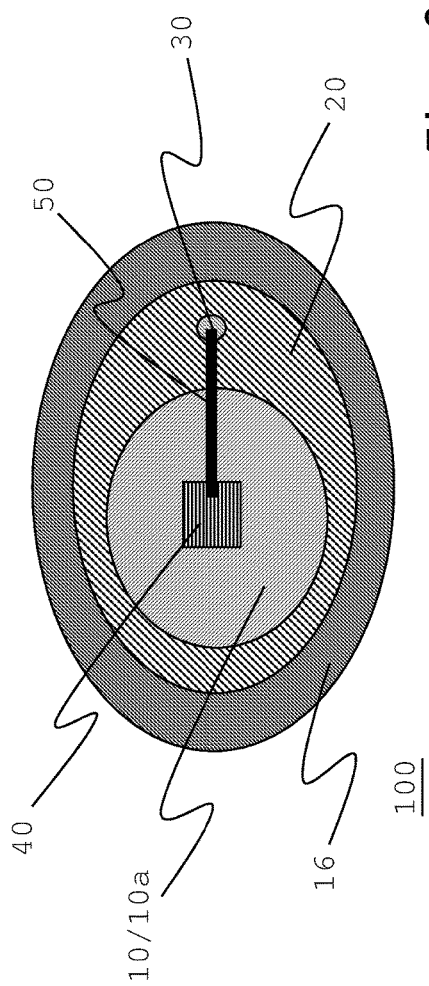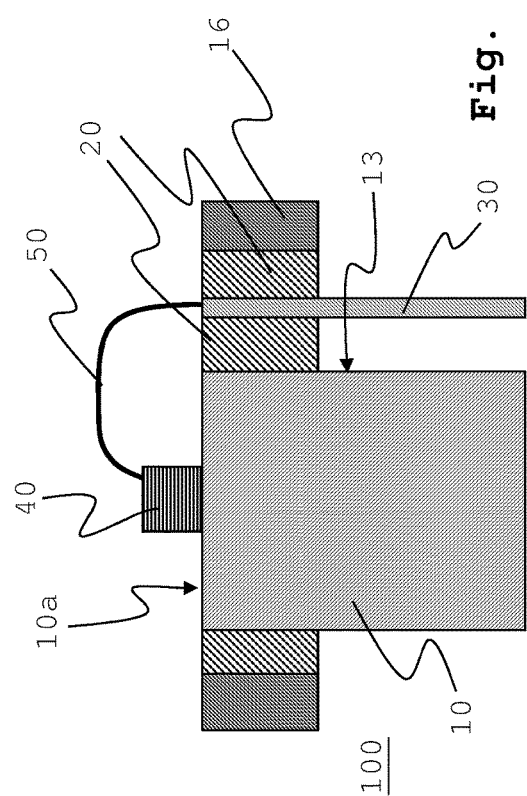

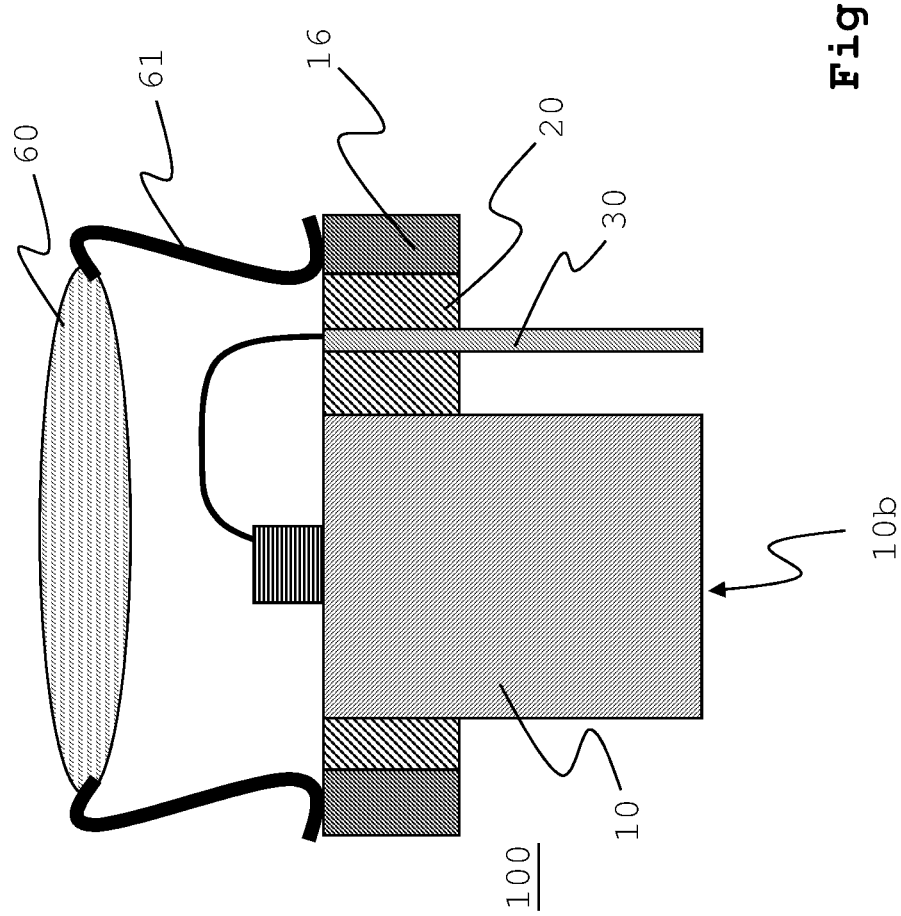
Fig. 2.c

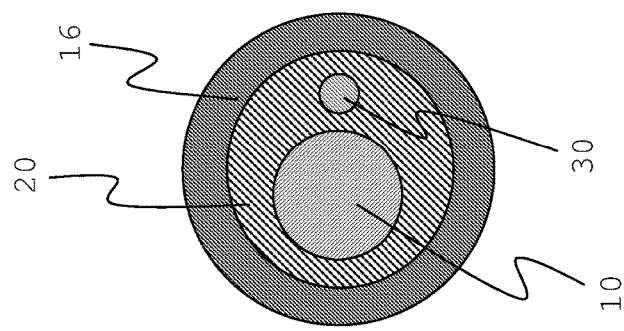
Fig. 3.c
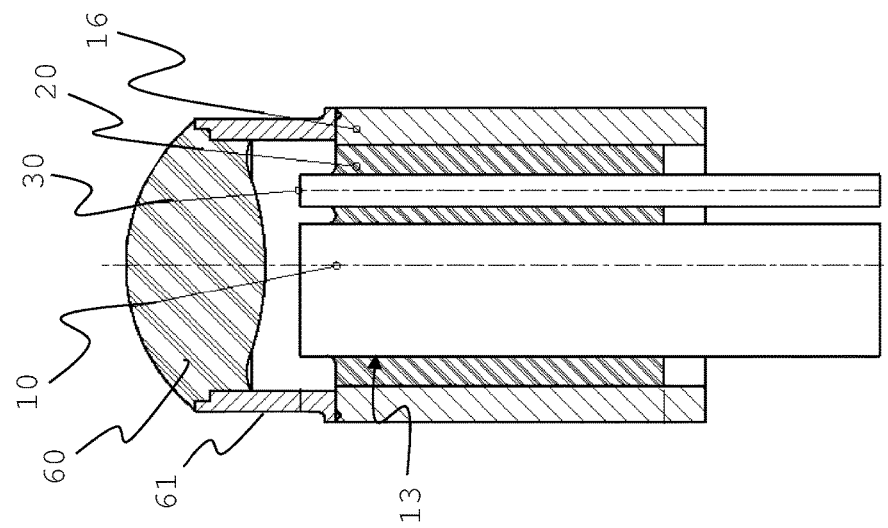
Fig. 3.b
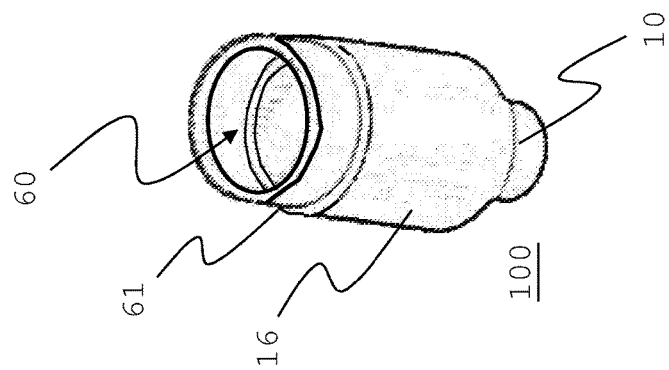
Fig. 3.a

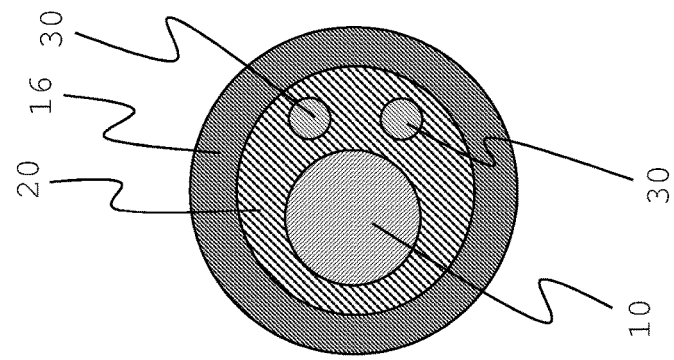
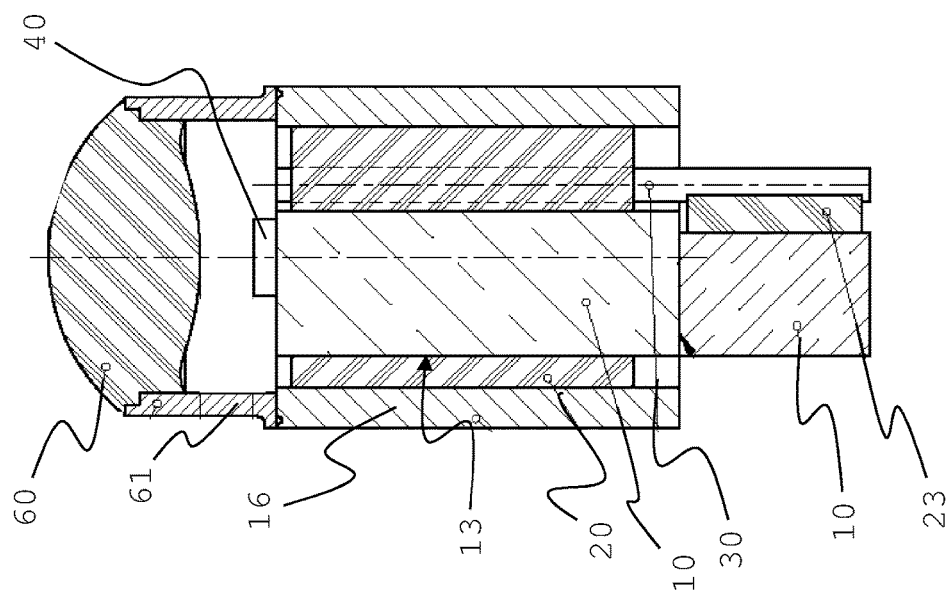
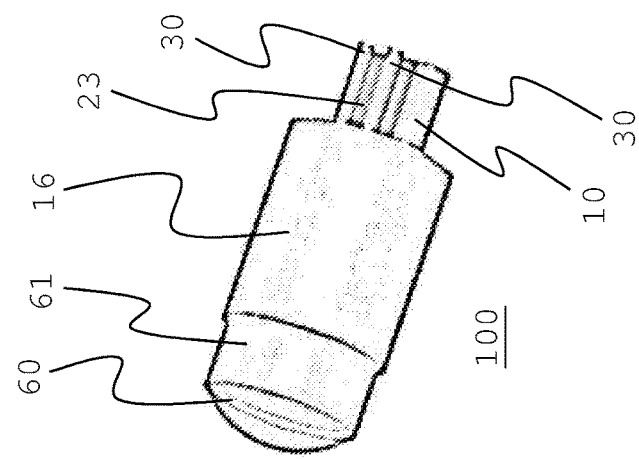
Fig. 4.a  Fig. 4.b  Fig. 4.c

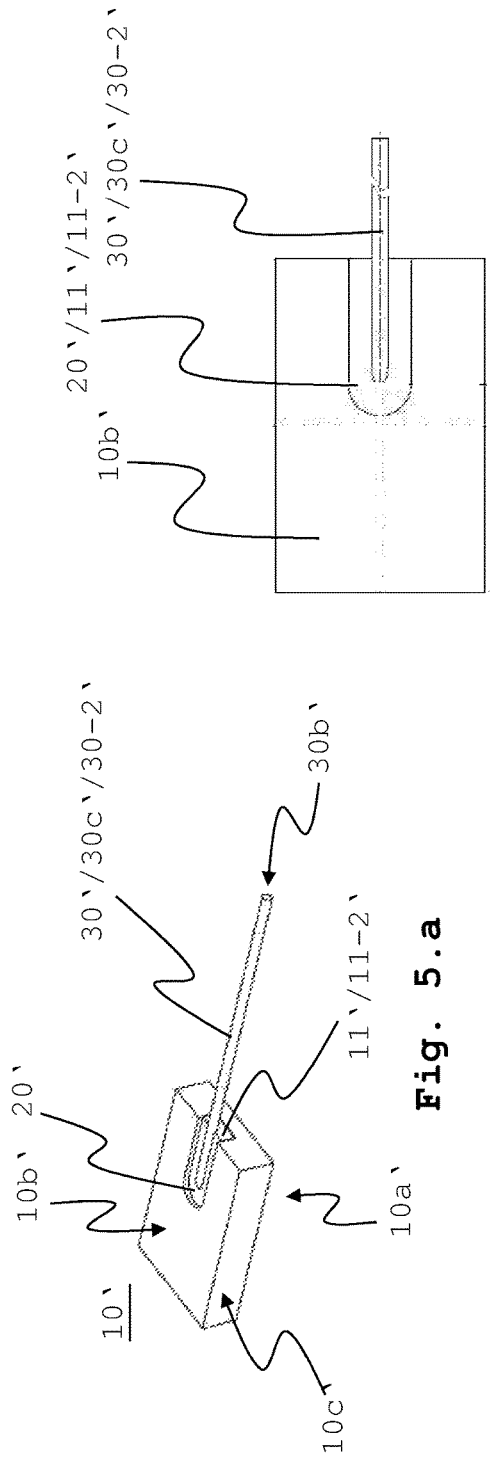
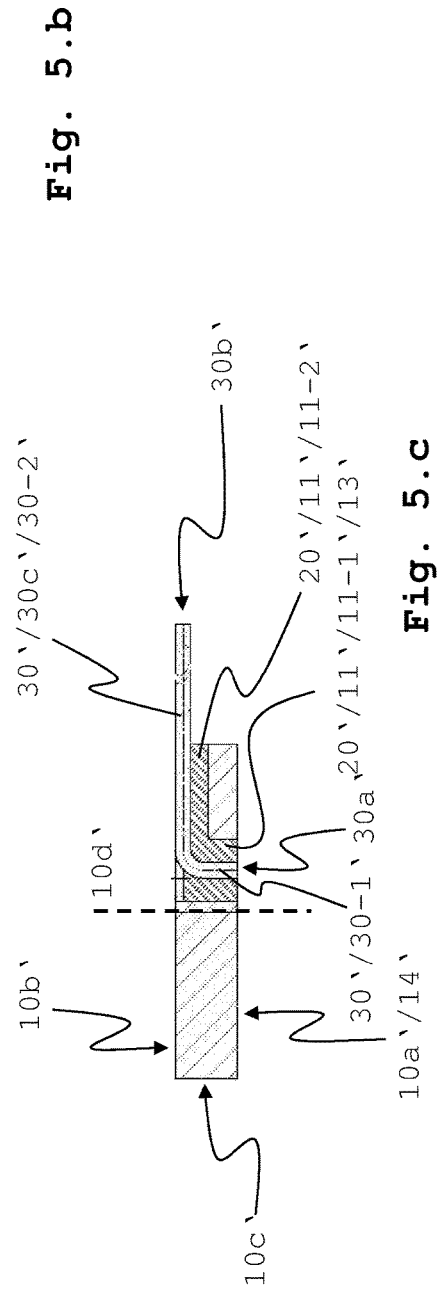

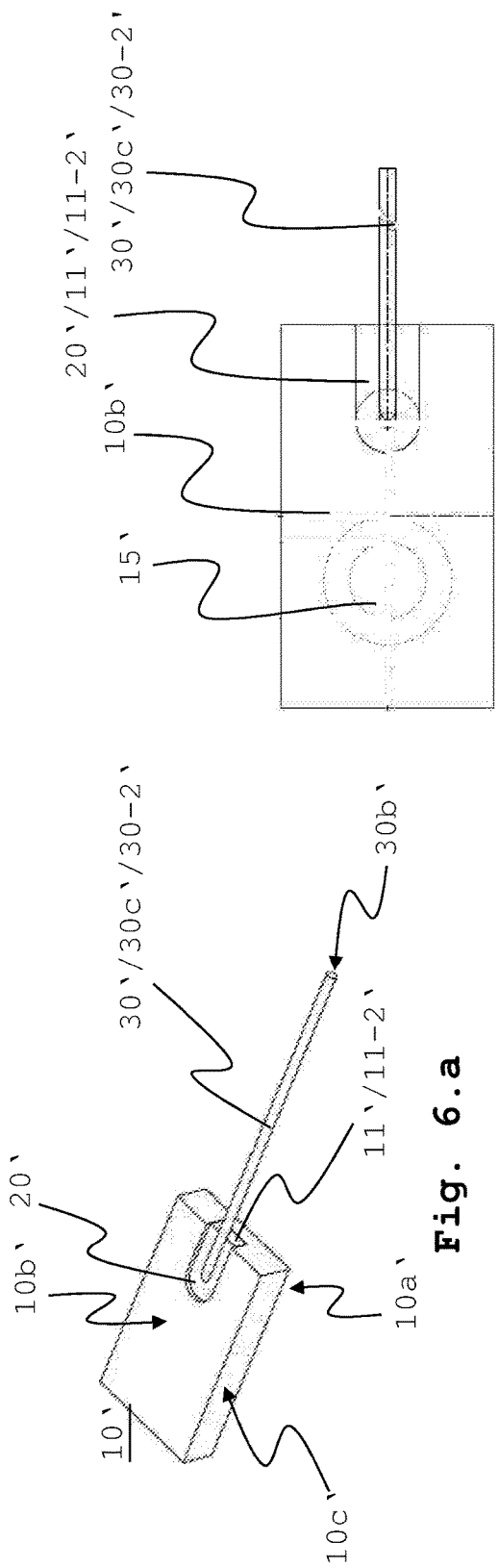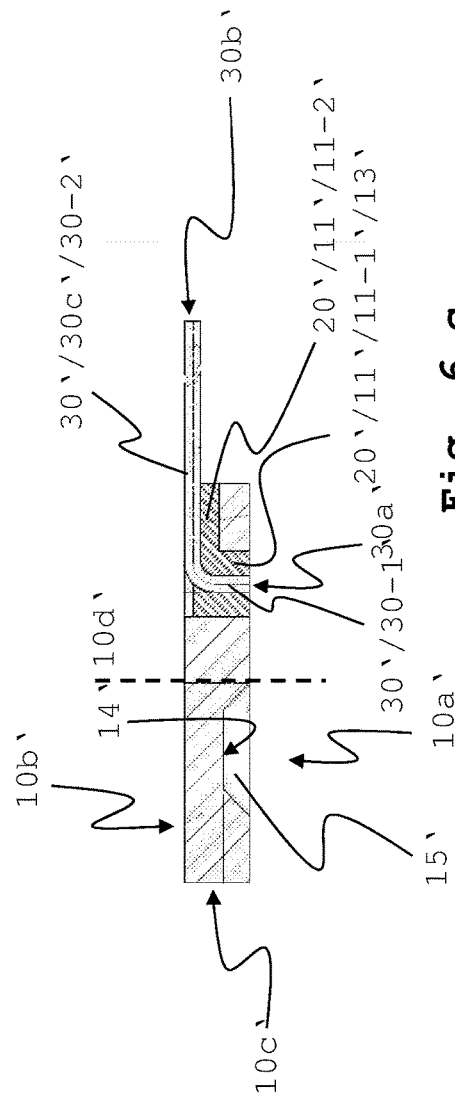

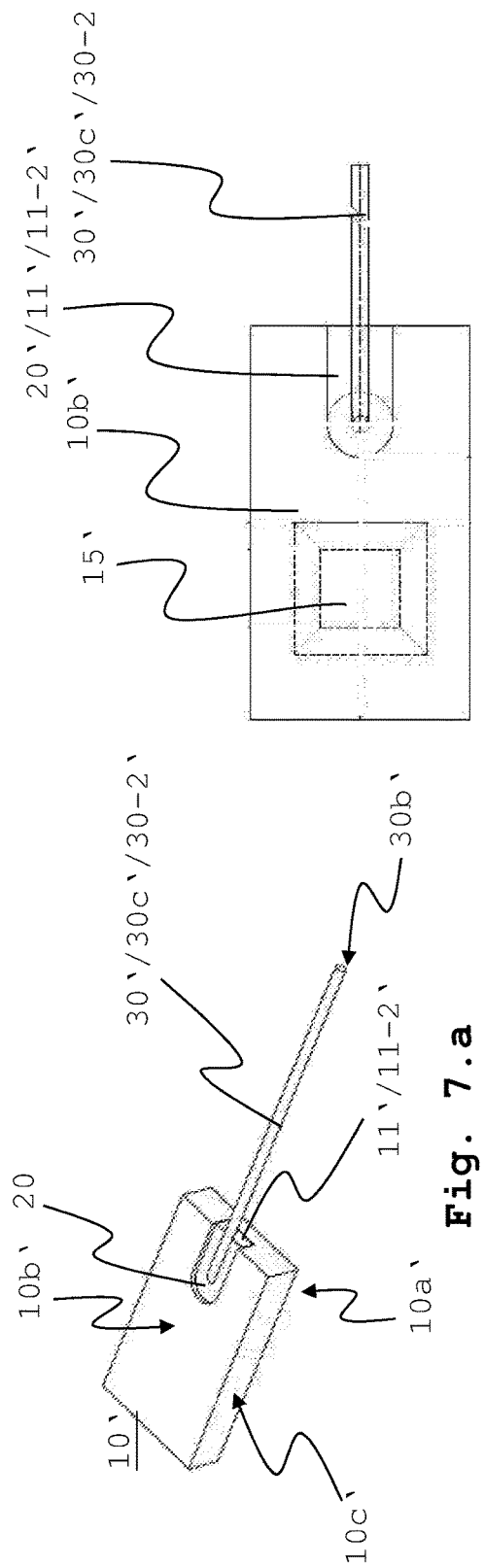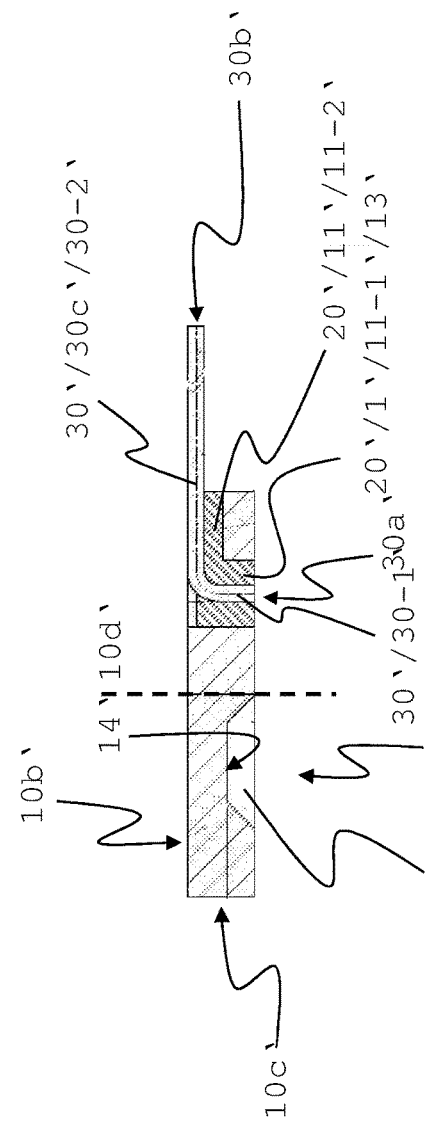

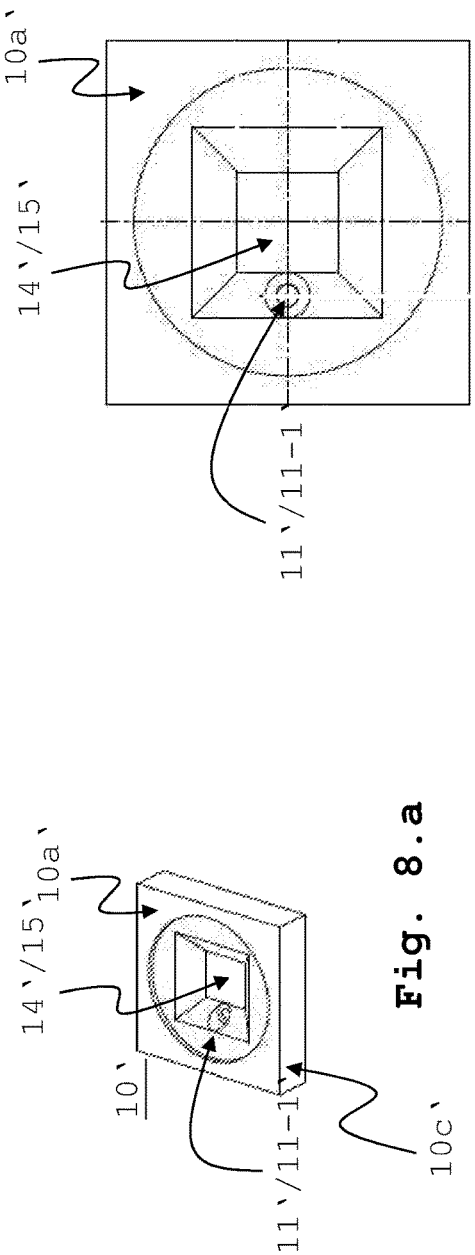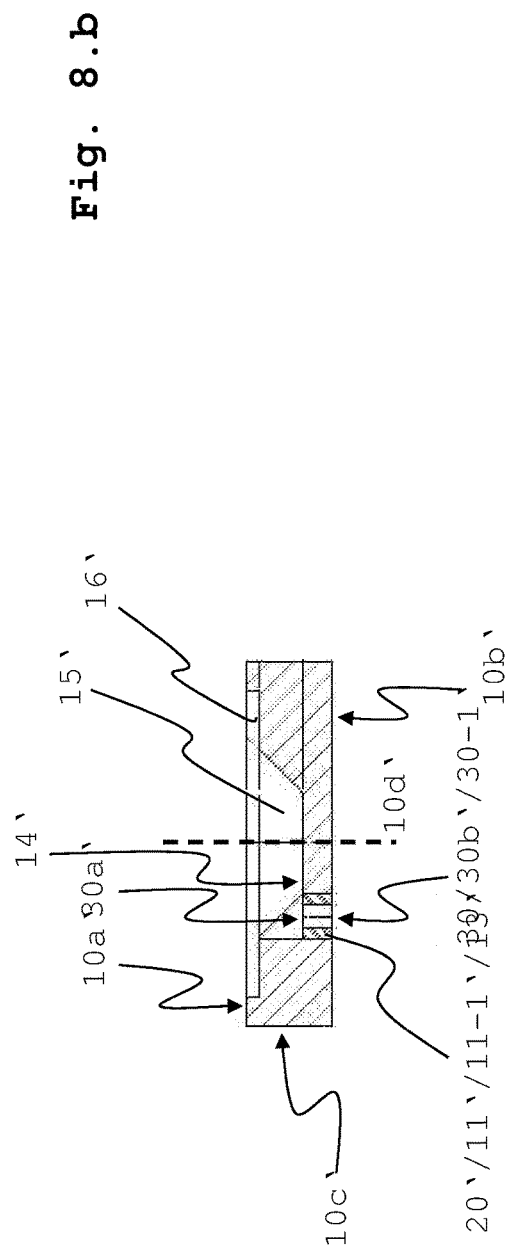

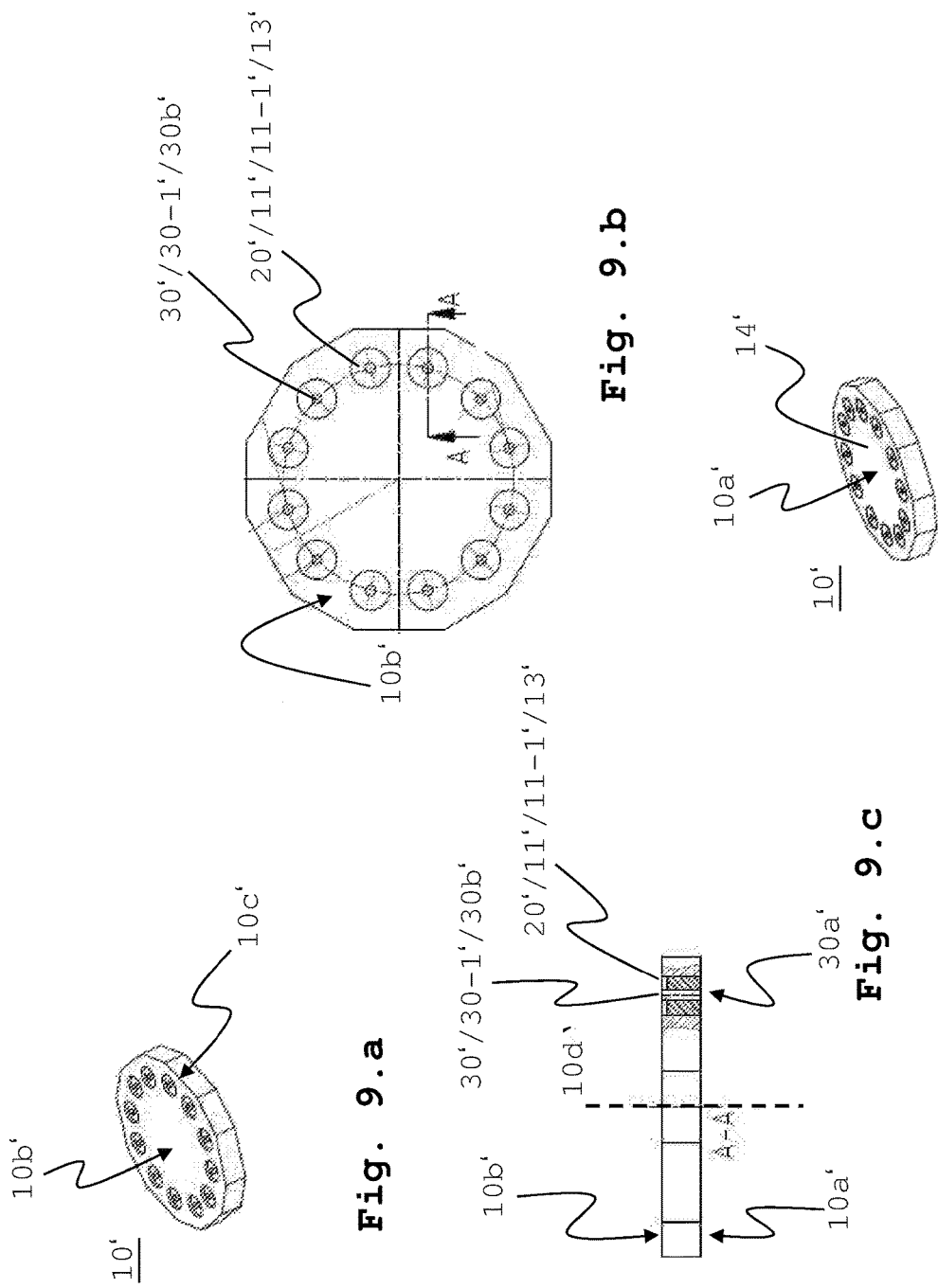

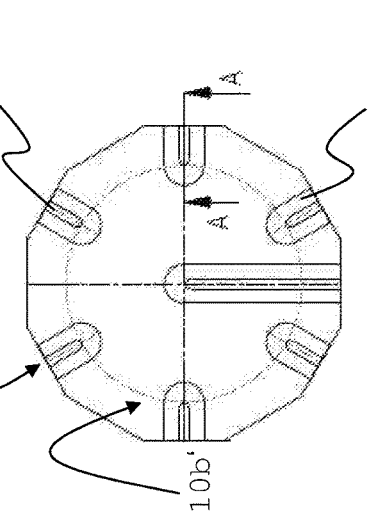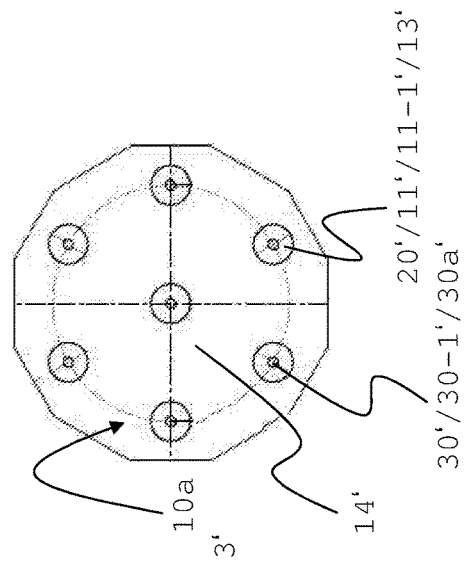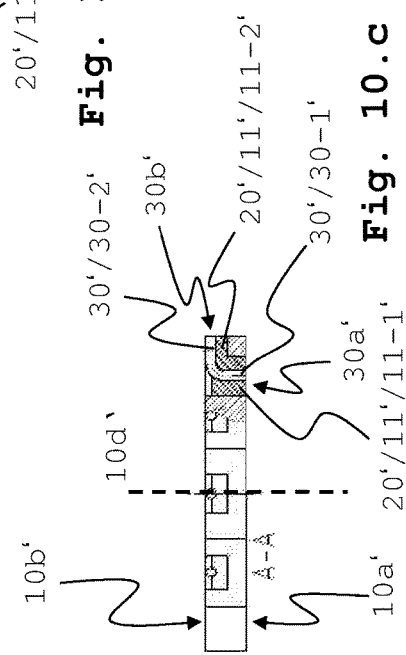

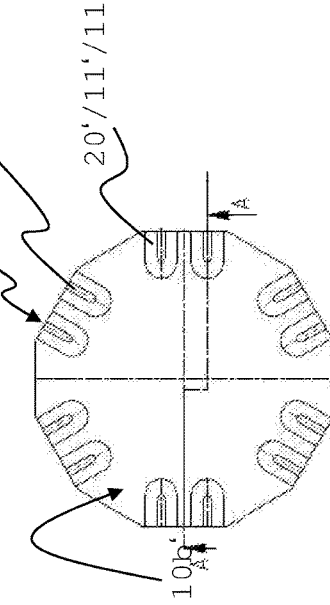
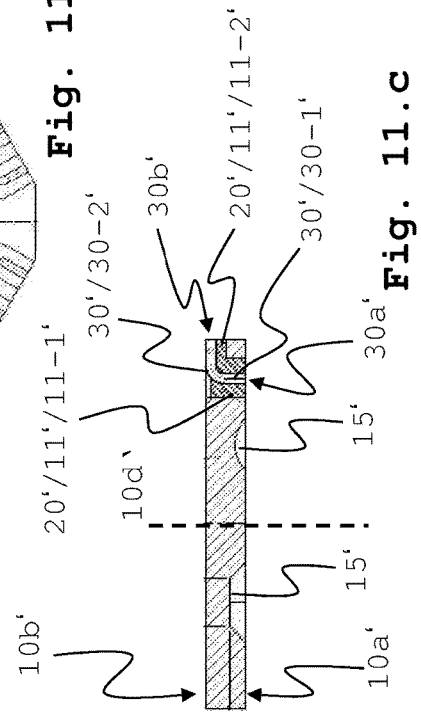
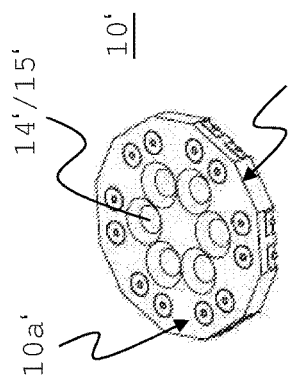
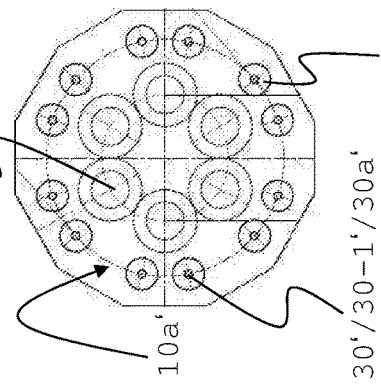
Fig. 11.a  Fig. 11.b  Fig. 11.c  Fig. 11.d  Fig. 11.e

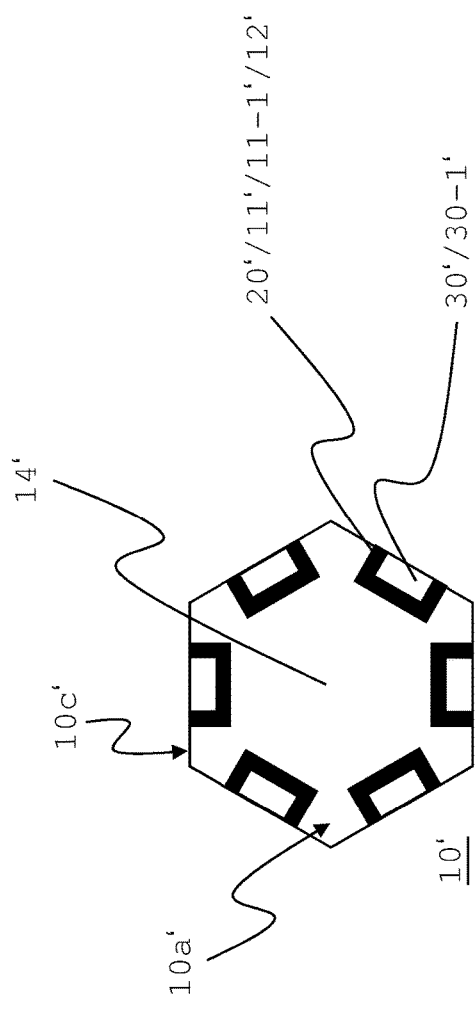
Fig. 12.a
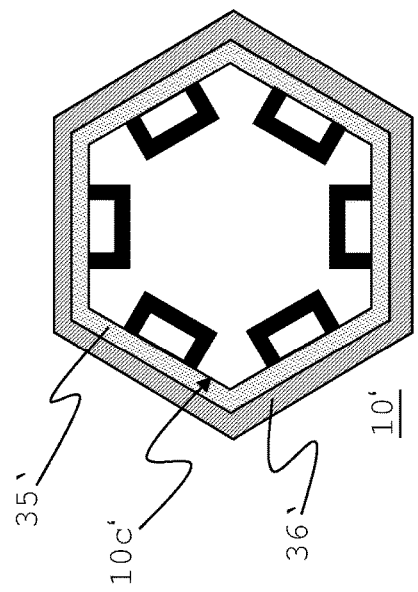
Fig. 12.b

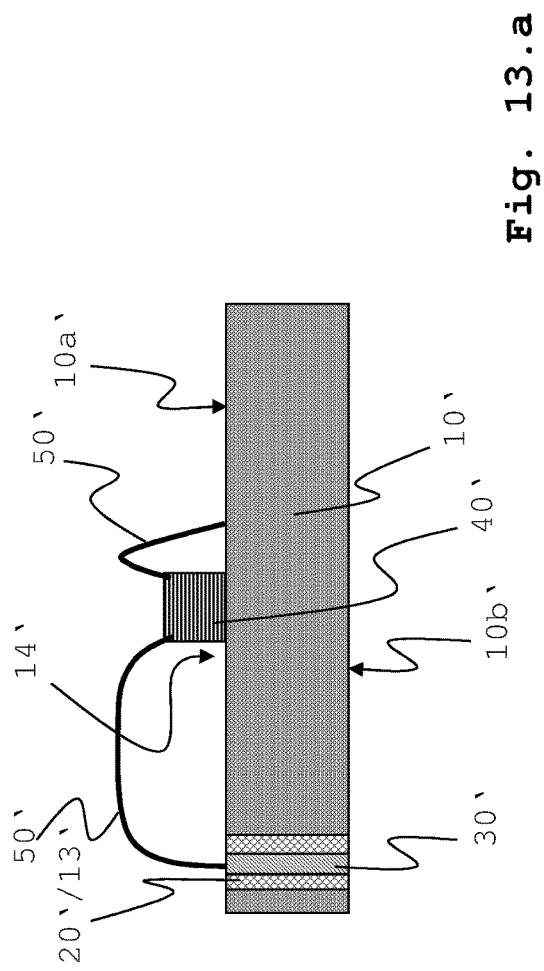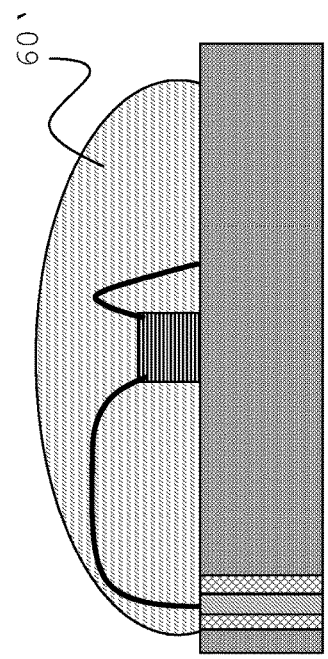
Fig. 13.a
Fig. 13.b

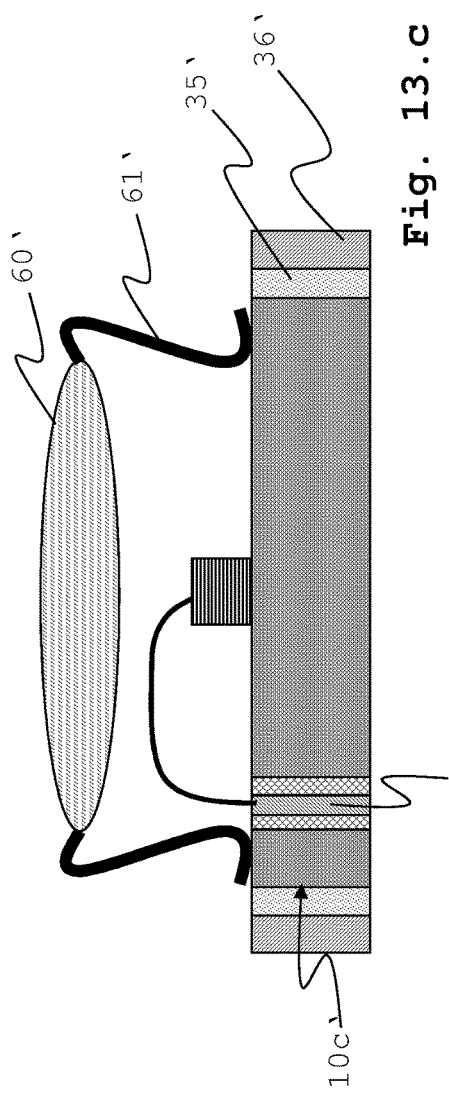
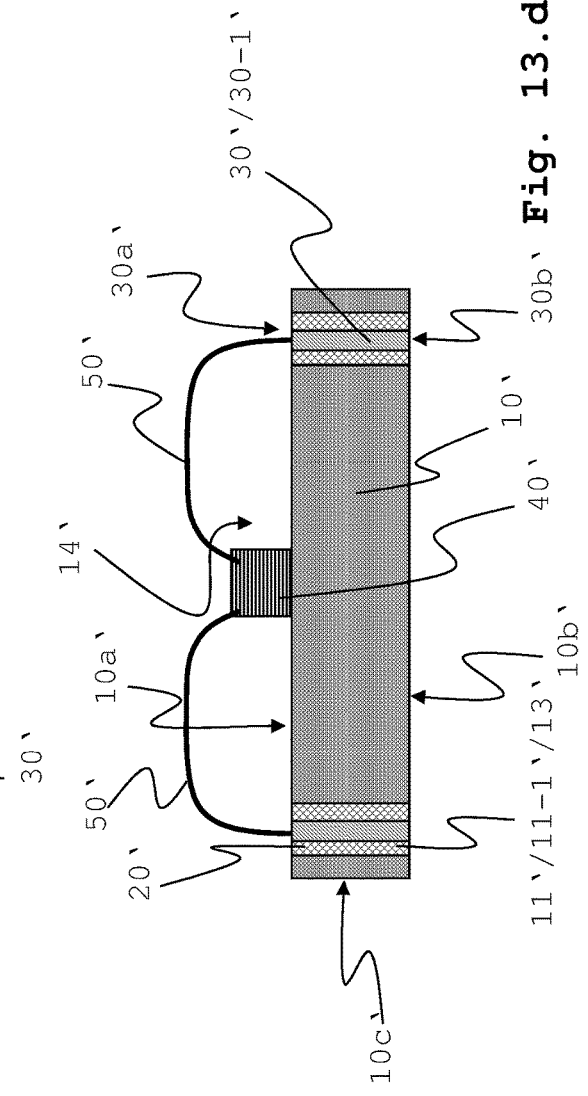

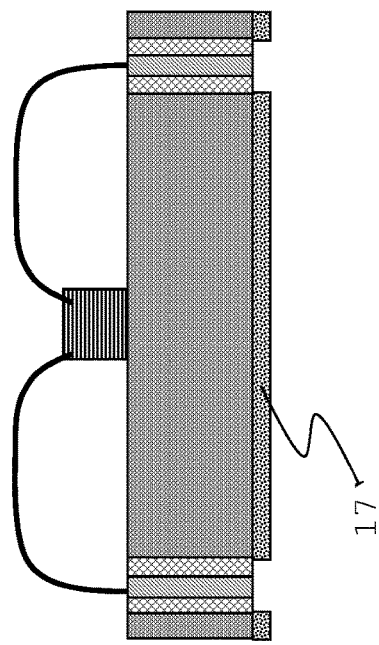
Fig. 13.e
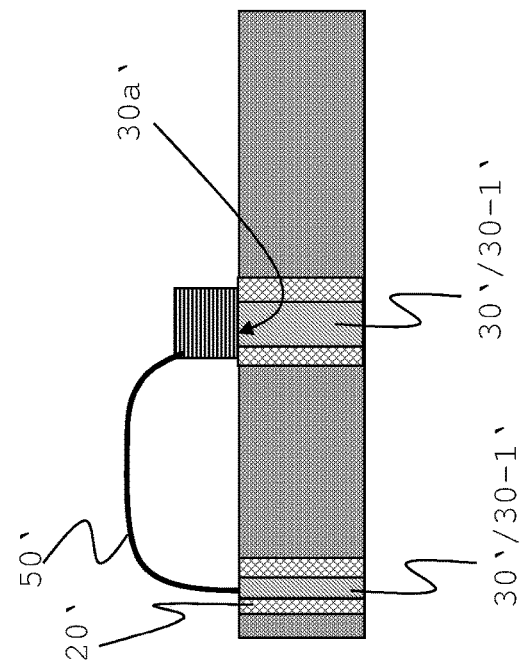
Fig. 13.f

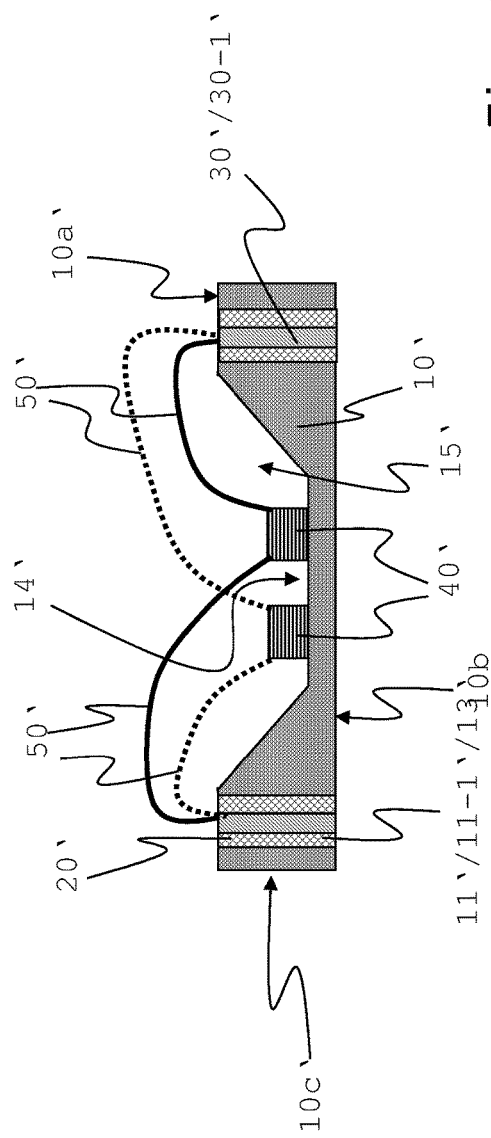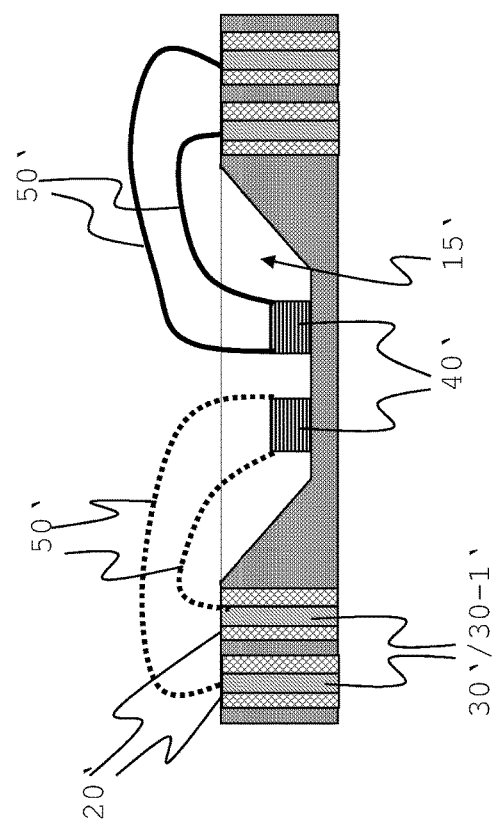
Fig. 14.a
Fig. 14.b

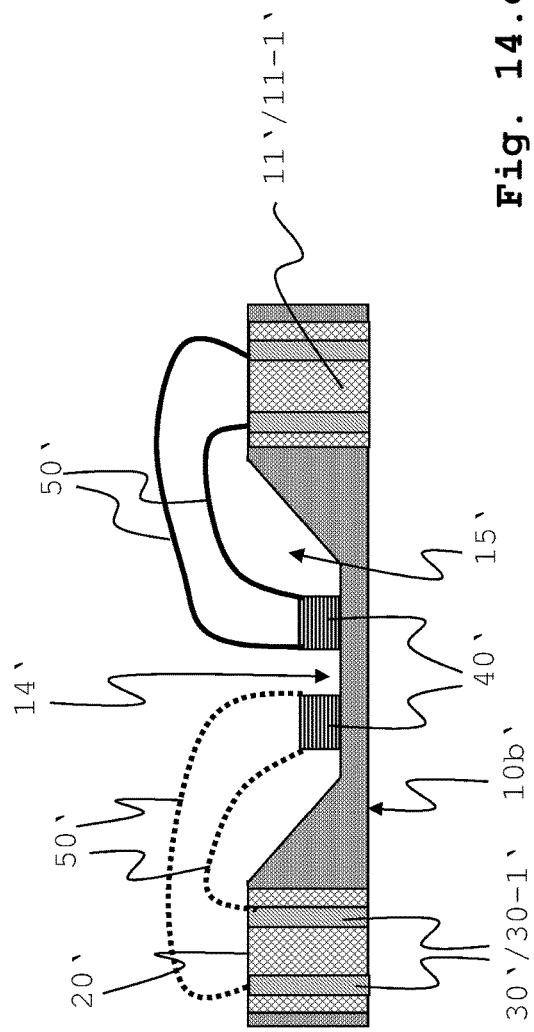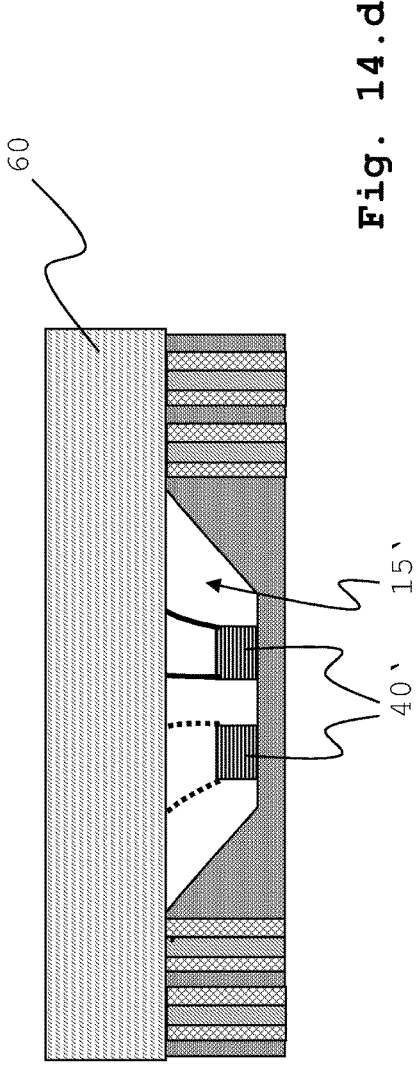

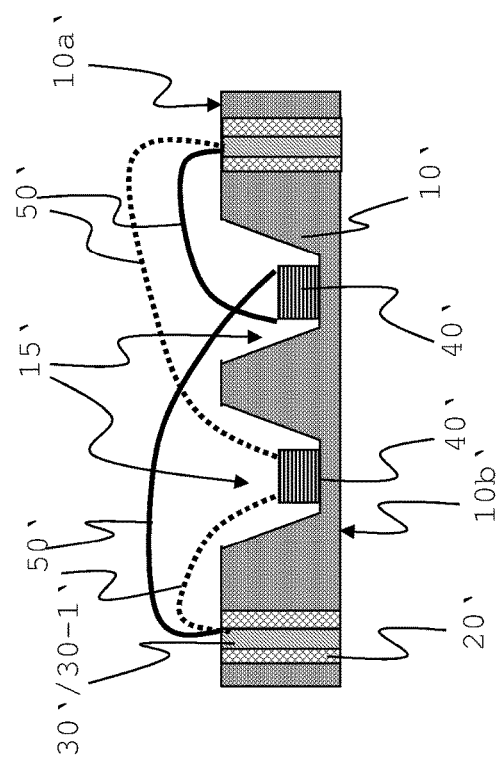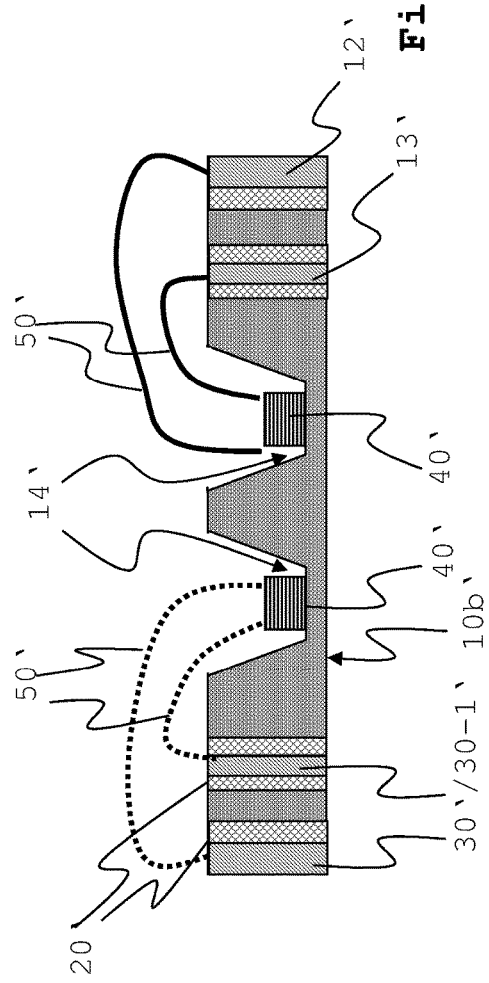

GLASS SYSTEM FOR HERMETICALLY JOINING CU COMPONENTS, AND HOUSING FOR ELECTRONIC COMPONENTS

FIELD OF THE INVENTION

The present invention relates to a housing for electronic components such as FETs and/or LEDs, and to the use of a particularly suitable glass for manufacturing such a housing.

BACKGROUND OF THE INVENTION

It is common practice nowadays to encapsulate electronic components, such as so-called high-power light emitting diodes (LEDs) or field effect transistors (FETs), in plastic and resin structures, i.e. in organic housings. However, a component disposed in such a housing is not sufficiently hermetically encapsulated from possible environmental influences. This may lead to a degradation of materials, surfaces, and/or electrical connections. In addition, thermal resistance of the resin has found to be problematic in case of high-output electronic components, e.g. 5 W LEDs, or a FET, to give an example of a power electronics device.

A technology to overcome these drawbacks has been described in patent application WO 2009/132838 A1. The contents of this patent application are fully incorporated in the present patent application by reference. A substantially fully inorganic housing is described therein, which is a housing comprising a composite structure of a metallic base part and a metallic head part disposed on the upper surface of the base part. These parts are joined together by means of a glass layer. An optoelectronic functional element, for example, is positioned upon the base part. The head part above the base part forms a reflector for radiation emitted from or for radiation to be received by the optoelectronic functional element, inter alia. When joining the base part, the glass layer, and the head part, the glass layer is heated until the glass reaches a viscosity at which the glass adheres and the base part and the head part form a composite structure by means of the first glass layer. The housing described therein has proved to be very advantageous. In particular the glass joint allows to produce a hermetic encapsulation with enhanced temperature resistance. This technology permits to economically produce small housing with the aforementioned advantages.

GENERAL DESCRIPTION OF THE INVENTION

Given the prior art background described above, an object of the present invention is to provide an alternative housing for electronic components, especially for high-power FETs and/or LEDs.

In particular it is intended to further improve the hermetic properties and/or long term stability of the housing.

These objects are already achieved by the housing for accommodating an electronic functional element and by the method of using an alkali titanium silicate glass to produce such a housing according to the independent claims. Advantageous embodiments of the housing according to the invention are set forth in the dependent claims.

Generally, the invention proposes to use an alkali titanium silicate glass to produce the housing, which permits to form an extremely hermetic housing, inter alia. This class of glasses and especially the glasses listed below have only been used for enameling so far. Upon enameling they are baked onto metal surfaces to create an extremely thin and hard protective coating. For example, the so-called enamel is applied to pots, ovens, freezers or the like, for sealing purposes. It is for the first time here, that the alkali titanium silicate glass is used for packaging, i.e. for forming housings in microelectronics.

Enameling focuses on sealing, for example of a pot. The structural or mechanical strength is substantially provided by the substrate to be sealed.

The inventors now have found that the class of glasses according to the invention and in particular the glasses mentioned below are not only useful for sealing but also for joining components, in particular copper-based components. The class of glasses according to the invention, and in particular the glasses listed below provide the required mechanical and structural strength to produce a housing, and in particular allow to provide the required layer thicknesses which are larger than for enameling.

Preferably, the alkali titanium silicate glass according to the invention, and in particular the glasses listed below are used for encapsulating electrical and/or electronic and/or optoelectronic components.

In detail, the present invention provides a housing for accommodating an electronic and/or optoelectronic functional element, in particular an LED and/or a FET. The housing according to the invention is a housing comprising
  a base body having an upper surface which at least partially defines a mounting area for at least one electronic functional element so that the base body forms a heat sink for at least one electronic functional element, and further having a lower surface, and a lateral surface; and
  at least one connecting body for at least one electronic functional element, which is joined to the base body at least by a glass layer; wherein
the bonding glass layer is provided by an alkali titanium silicate glass.

Base body and connecting body comprise a metal, preferably a metal having a coefficient of mean linear thermal expansion $\alpha$ from 13 to $25*10^{-6}K^{-1}$. In particular copper or a copper alloy is used.

Furthermore within the scope of the invention is the use of an alkali titanium silicate glass to produce a housing for accommodating an electronic and/or optoelectronic functional element, in particular an LED and/or a FET.

The at least one functional element is or has been disposed upon the base body. On the one hand, the base body constitutes a supporting member for the functional element. Therefore, the base body may also be referred to as a carrier or base. On the other hand, the base body constitutes a heat sink for the functional element.

The base body may be formed in one piece or of segments, and may for example consist of layers. Also, passageways, i.e. so-called thermal vias may be formed in the base body. After having been installed in the housing or placed upon the base body, the functional element is in direct contact with the base body. The upper surface of the base body generally is that side of the base body on which the functional element is positioned.

The functional element may for example be glued to and/or soldered to the base body. As a solder, lead-free soft solders are preferably used. An adhesive that may be used is preferably a conductive adhesive such as an epoxy enriched with silver. Thus, the wording direct contact also refers to a contact via an adhesive, a solder, or a binding agent.

Since according to the invention the base body also constitutes a heat sink for the functional element, it comprises materials that exhibit appropriate thermal conductivity. Preferably, the base body has a thermal conductivity of at least about 50 W/mK, preferably at least about 150 W/mK.

The base body may be thermally coupled to other components. Preferably, the base body and/or a head portion comprises at least one metal or is made of a metal or an alloy. Especially, the metal or alloy is at least one selected from a group consisting of copper, aluminum, austenitic steel, and austenitic stainless steel.

Generally, in a plan view of the upper surface, the base body has a surface area from about 9 mm$^2$ to about 1000 mm$^2$, preferably not more than about 400 mm$^2$ or 50 mm$^2$. Its height generally ranges from about 0.1 mm to about 10 mm, preferably up to about 2 mm.

For other possible embodiments of the base body reference is made to the base part described in document WO 2009/132838 A1.

The at least one connecting body is a connecting body for providing an electrical connection for the functional element placed on the upper surface of the base body. Generally, the connecting body permits to establish a connection between the upper surface of the base body and thus of the functional element with the surroundings.

The at least one connecting body is a solid body. It is in particular provided as a metal plate and/or as a metallic contact pin. Preferably, it may even be deformable under slight pressure, for example when being compressed with the fingers. It does not constitute a layer deposited or grown on the base body, for example using a PVD process.

The connecting body comprises or is made up of a metal or an alloy. The metal or alloy is at least one selected from a group consisting of copper, aluminum, austenitic steel, and austenitic stainless steel.

If the connecting body is implemented as a plate, the connecting body has a surface area, in a plan view of the upper surface thereof, from about 9 mm$^2$ to about 1000 mm$^2$, preferably of not more than about 400 mm$^2$, or 50 mm$^2$. Its height generally ranges from about 0.1 mm to about 5 mm, preferably up to about 2 mm.

For other possible embodiments of the connecting body as a metallic plate reference is made to the head part described in document WO 2009/132838 A1.

A contact pin is an elongated metal component having a very reduced cross-sectional area relative to the length thereof. It is a needle-shaped or nail-like component. It may comprise only one rectilinear leg, or may also have at least one bent portion. Thus, in one embodiment, the contact pin may be provided as a substantially straight or I-shaped pin, in particular at least in sections thereof. However, in another embodiment it may be provided as a hook or with an L-shape, in particular at least in sections thereof. A metallic wire is also to be understood as a contact pin.

If the connecting body is embodied as a contact pin, the cross-sectional area of the connecting body generally ranges from about 0.1 mm$^2$ to about 16 mm$^2$, preferably up to not more than about 3 mm$^2$, more preferably up to not more than about 0.8 mm$^2$.

The connecting body is electrically insulated from the base body. It is separated by the glass layer, at least sections thereof, and/or it is arranged spaced apart from the base body, at least sections thereof.

The glass is a glass for joining the base body to the connecting body and for insulating the base body from the connecting body.

The glass has a softening temperature in a region below the melting temperature of the materials used for the base body and/or the connecting body. For joining or upon joining, the glass is or has been heated to an extent to have a viscosity at which the components adhere to each other. Upon joining, the glass preferably has a viscosity in a range from 10$^7$ Pa·s to about 10$^3$ Pa·s. Heating is accomplished in a furnace, for example.

The employed glass is an alkali titanium silicate glass. The alkali titanium silicate glass is chosen in function of the material of the base body and/or of the connecting body. The alkali titanium silicate glass is particularly suitable for an embodiment in which the base body and/or the connecting body substantially comprise copper and/or aluminum, in particular at the boundary surface(s) to the glass. The base body and/or the connecting body and/or at least the respective boundary surface has/have a copper or aluminum content of at least 50 wt. %, preferably of at least 80 wt. %.

In one embodiment, the glass has or comprises the following composition (in percent by weight):

| | |
|---|---|
| SiO$_2$ | 20-50 |
| TiO$_2$ | 10-35 |
| R$_2$O | 10-40 |
| Al$_2$O$_3$ | 0-5 |
| CaO + SrO | 0-5 |
| P$_2$O$_5$ | 0-5 |
| V$_2$O$_5$ | 0-5 |
| B$_2$O$_3$ | 0-5 |
| Sb$_2$O$_3$ | 0-1 |
| SnO$_2$ | 0-5 |
| Fe$_2$O$_3$ | <1 |
| CoO | <1 |
| NiO | <1 |
| ZnO | 0-4 |
| ZrO$_2$ | 0-4 |
| F | 0-2 |
| MoO$_3$ | 0-1 |
| N$_2$O$_5$ | 0-6 |
| SO$_3$ | 0-1 |

The term R$_2$O as used in the table represents the sum of all alkali oxides. The alkali metals therein are provided at least by elements Li, Na, and K.

In one specific embodiment, the R$_2$O group includes the following components (in percent by weight):

| | |
|---|---|
| Na$_2$O | 11-22 |
| K$_2$O | 8-17 |
| Li$_2$O | 0.2-3 |

In a first preferred embodiment, the glass has or comprises the following composition:

| | |
|---|---|
| SiO$_2$ | 26-30 |
| TiO$_2$ | 21-25 |
| Na$_2$O | 14-18 |
| K$_2$O | 11-15 |
| Li$_2$O | >0-3 |
| Al$_2$O$_3$ | >1-5 |
| CaO | >0-1 |
| SrO | 0-1 |
| P$_2$O$_5$ | >0-3 |
| B$_2$O$_3$ | >0-4 |
| Fe$_2$O$_3$ | >0-2 |
| CoO | 0-1 |
| NiO | 0-1 |
| ZnO | >0-2 |
| ZrO$_2$ | >0.5-2 |

Preferably, the glass of the first embodiment has or comprises the following composition:

| | |
|---|---|
| SiO$_2$ | 28 |
| TiO$_2$ | 23 |
| Na$_2$O | 16 |
| K$_2$O | 13 |
| Li$_2$O | 1.12 |
| Al$_2$O$_3$ | 3.4 |
| CaO | 0.2 |
| SrO | 0.02 |
| P$_2$O$_5$ | 1.6 |
| B$_2$O$_3$ | 2 |
| Fe$_2$O$_3$ | 0.2 |
| CoO | 0.03 |
| NiO | <0.02 |
| ZnO | 0.2 |
| ZrO$_2$ | 0.9 |

In a second preferred embodiment, the glass has or comprises the following composition:

| | |
|---|---|
| SiO$_2$ | 36-40 |
| TiO$_2$ | 24-28 |
| Na$_2$O | 15-19 |
| K$_2$O | 10-14 |
| Li$_2$O | >0-3 |
| Al$_2$O$_3$ | 1-6 |
| CaO | >0-1 |
| SrO | <1 |
| P$_2$O$_5$ | >0-4 |
| B$_2$O$_3$ | >0-2 |
| Fe$_2$O$_3$ | 0-2 |
| CoO | <1 |
| NiO | <1 |
| ZnO | <1 |
| ZrO$_2$ | <1 |

Preferably, the glass of the second embodiment has or comprises the following composition:

| | |
|---|---|
| SiO$_2$ | 38 |
| TiO$_2$ | 26 |
| Na$_2$O | 17 |
| K$_2$O | 11.6 |
| Li$_2$O | 1.22 |
| Al$_2$O$_3$ | 3.7 |
| CaO | 0.3 |
| P$_2$O$_5$ | 1.6 |
| B$_2$O$_3$ | 0.29 |
| Fe$_2$O$_3$ | 0.08 |
| CoO | |
| NiO | <0.02 |
| ZnO | 0 |
| ZrO$_2$ | 0.1 |

The glass layer formed by the glass, or in more detail the glass layer formed between the base body and the connecting body generally has a thickness of more than about 30 μm. This permits to provide a gas-tight bonding with sufficient electrical insulating properties. The electrical resistance of the glass layer is generally greater than 1 GΩ. The gas tightness achieved is generally less than 1*10$^{-8}$ mbar*l/s. The thickness of the glass layer depends on the embodiment of the housing. Preferably, the thickness of the glass layer ranges from about 30 μm to about 2000 μm, and in particular is not more than about 1000 μm.

Furthermore, the glass according to the invention is distinguished by an improved strength and improved chemical resistance. For example, with the glass of the present invention shear strength in a sample body (4 mm×4 mm of glazing surface, and 100 μm of nominal thickness of the glass layer) can be increased as compared to the glass P8061, from an average of 60 N to 105 N. In addition, the glass of the invention has an improved chemical resistance as compared to the glass G018-122 (see WO 2009/132838 A1). Electro-plating may be performed after vitrification.

Generally, the glass may be applied by at least one method selected from a group consisting of screen printing, dispensing, providing of a preferably punched glass strip, and/or providing of an individual preform. A glass strip may for example be provided by molding slip into a strip shape.

The present invention may also be described by a method which is a method for producing an electronic functional element housing. The method comprises the steps of:
  providing at least one base body having an upper surface which at least partially defines a mounting area for at least one electronic functional element, so that the base body forms a heat sink for at least one electronic functional element;
  providing at least one connecting body for at least one electronic functional element, and at least one glass, in particular between the base body and the connecting body, for joining a connecting body to the base body;
  heating the glass until it has and/or reaches a viscosity at which it adheres, so that a composite can be formed from the base body and the connecting body;
  cooling the glass, so that the base body and the at least one connecting body form a material bond.

Upon joining, the heated glass has a temperature ranging from 400° C. to 1000° C., preferably from 500° C. to 700° C.

For other possible embodiments of the glass layer and the method of using a glass layer, reference is made to the first and/or second glass layer described in document WO 2009/132838 A1.

In order to cause better adherence of the connecting body to the base body, preferably, the glass contacting surfaces of the base body and/or the connecting body are pretreated. In one embodiment, the pre-treatment may comprise a pre-oxidation of the glass contacting surfaces. Pre-oxidation refers to a selective oxidation of a surface, for example in an oxygen-containing atmosphere. In this case, a composite of glass and copper or copper oxide has proved to be very stable. The metal, preferably copper, is selectively oxidized in an oxygen-containing atmosphere. In terms of oxide weight, a mass per unit area from about 0.02 to about 0.25 mg/cm$^2$, preferably from about 0.067 to about 0.13 mg/cm$^2$, has proved to be advantageous for the oxide weight. The oxide adheres well and does not flake. This is particularly true when the copper is provided in a proportion of more than 50 wt. %, preferably more than 80 wt. %, in the base body and/or in the connecting body and/or at the boundary surfaces. The glass of the present invention is in particular compatible with the expansion of copper.

To improve the properties of the base body and/or the connecting body, for example reflectivity, bondability and/or electrical conductivity, these bodies may preferably be coated and/or covered, at least partially, preferably with a metal. The material, preferably the metal, for producing the coating and/or the lining is at least one material selected from a group consisting of silver, aluminum, nickel, palladium, and gold. The method for generating or producing the coating is at least one method selected from a group consisting of electro-plating, and vapor deposition, in particular PVD and/or CVD.

In a first embodiment, the glass layer or the glass is disposed at the upper surface and/or the lower surface of the base body, at least on sections thereof. The glass layer is preferably disposed between the upper surface of the base body and the lower surface of the at least one connecting body, at least in sections thereof. In one variation, the at least one connecting body extends beyond the base body, at least portions thereof. It provides at least one tab for connection purposes.

In a modification of the housing, a head portion is placed on the upper surface of the base body and on the upper surface of the at least one connecting body. For possible embodiments of the head portion, reference is made to the head part as described in document WO 2009/132838 A1.

In a second embodiment, the glass layer or the glass is disposed between the lateral surface of the base body and the connecting body, at least in sections thereof. For this purpose, the at least one connecting body is arranged along the lateral side of the base body. The connecting body extends along the circumferential surface of the base body, at least partially.

In another embodiment of the housing, an insulation is applied at least on the lower surface thereof. To this end, an insulation is provided on the lower surface of the base body and optionally on the lower surface of the connecting body, preferably provided by an insulating layer. The insulation may be continuous or segmented. The insulation material preferably is or comprises a glass and/or a ceramic material. The layer may be applied, for example, by enamelling and/or by a cold spray process. This permits to keep the lower surface of the housing electrically floating.

In another embodiment of the housing, a sleeve is arranged at the lateral side of the base body. The sleeve or sheath extends around the circumferential surface of the base body and/or the connecting body, at least in sections thereof. The sleeve is attached to the base body and/or to the connecting body through the or a glass layer. The glass layer is disposed between the base body and the sleeve. The sleeve is preferably provided as a metal sleeve, for example of stainless steel. Thereby, it is possible to provide at least the outer surface of the housing at a defined potential, for example ground potential.

Furthermore within the scope of the invention is an electronic and/or optoelectronic component which comprises a housing according to the invention and at least one radiation emitting and/or radiation receiving optoelectronic functional element, in particular an LED, and/or at least one power electronics device, in particular a FET, which is disposed in the housing.

The housing and/or the electronic component and/or the optoelectronic component is/are particularly suitable for use in a harsh environment, for example when exposed to moisture and/or aggressive gas and/or radiation.

Also within the scope of the invention is an illumination device, such as an interior lighting and/or exterior lighting, comprising at least one housing and/or one optoelectronic component according to the present invention, in particular for use in vehicles and/or in an aircraft and/or as an airfield lighting. Examples of the illumination device include a seat lighting, a reading light, a work light that may especially be integrated in ceilings or walls, an object lighting in furniture and/or buildings, a headlamp and/or rear light and/or interior lighting and/or instrument or display lighting, preferably in motor vehicles and/or aircraft, a backlight for LCD displays, a UV light, preferably in medical and/or water purification applications, and/or a lighting for harsh environments such as when exposed to moisture and/or aggressive gas and/or radiation.

The invention further relates to a housing for optoelectronic components such as LEDs, and to a method for producing such a housing.

Generally, the invention proposes to reduce the housing as described in the prior art and made up of at least two layers, to a housing which is only formed of a single layer. It is a one-layered housing. Generally, the housing comprises a base body and at least one connecting body mounted in and/or at the base body. Preferably, the housing is a substantially inorganic housing. It consists of or comprises the metallic base body, the glass, and at least one metallic connecting body. Usually, there are no other components disposed on the upper surface of the housing, which is provided by the base body in this case. However, optionally, it is possible to close the inventive housing on the upper side thereof by an optical component, once an optoelectronic functional element has been mounted or placed.

In detail, the present invention provides a housing for accommodating an optoelectronic functional element, in particular an LED, which comprises at least the following constituents or consists of the following constituents. The housing according to the invention is a housing comprising
  a base body having an upper surface which at least partially defines a mounting area for at least one optoelectronic functional element so that the base body forms a heat sink for at least one optoelectronic functional element, and further having a lower surface, and a lateral surface; and
  at least one connecting body for at least one optoelectronic functional element, which is coupled with the base body, in particular by a material bonding; wherein
  the base body has at least one channel, in which the at least one connecting body is arranged, at least sections thereof, and which is at least partially filled with a glass for joining the base body to the connecting body.

Furthermore within the scope of the invention is a method for producing an optoelectronic functional element housing, in particular for an LED, comprising the method steps of:
  providing at least one base body including at least one channel and having an upper surface which at least partially defines a mounting area for at least one optoelectronic functional element, so that the base body forms a heat sink for at least one optoelectronic functional element;
  providing at least one connecting body for at least one optoelectronic functional element, and at least one glass for joining the at least one connecting body to the base body, within the at least one channel;
  heating the glass in the at least one channel until it has and/or reaches a viscosity at which it adheres, so that a composite structure can be formed from the base body and the connecting body;
  cooling the glass, so that the base body and the at least one connecting body form a material bond, wherein the at least one connecting body is embedded in the glass, at least portions thereof.

In a preferred embodiment of the method, the base body and/or the connecting body and/or the glass are provided in a respective array. The housing of the invention is in particular producible or produced by the method according to the invention. The method according to the invention is preferably adapted for producing the housing of the invention. The sequence of the individual method steps may vary.

The at least one functional element is placed upon the base body. On the one hand, the base body is a load bearing element for the functional element. Therefore, the base body may also be referred to as a carrier or base. On the other hand, the base body constitutes a heat sink for the functional element.

The base body may be formed in one piece or of segments, and may for example comprise layers. Moreover, passageways, i.e. so-called thermal vias may be formed in the base body. After having been received in the housing or placed upon the base body, the functional element is in direct contact with the base body.

The functional element may for example be glued to and/or soldered to the base body. Solders preferably used are lead-free soft solders. The adhesive is preferably a conductive adhesive such as an epoxy enriched with silver. Thus, direct contact also refers to a contact via an adhesive, a solder, or a binding agent.

Since according to the invention the base body also constitutes a heat sink for the functional element, it comprises materials having an appropriate thermal conductivity. Preferably, the base body exhibits a thermal conductivity of at least about 50 W/mK, preferably at least about 150 W/mK.

The base body may be thermally coupled to other components. Preferably, the base body comprises at least one metal or is made of a metal or of an alloy. A common metal, for example, is copper and/or aluminum and/or nickel and/or iron and/or molybdenum and/or copper-tungsten and/or Cu-molybdenum.

For other possible embodiments of the base body, reference is made to the base part described in document WO 2009/132838 A1.

The mounting area for at least one functional element may be in the center or in the region of the central axis or at the central axis of the base body.

Generally, in a plan view of its upper surface, the base body has a surface area from about 5 mm$^2$ to about 1000 mm$^2$, preferably of not more than about 250 mm$^2$. The height of the base body generally ranges from about 0.2 mm to about 10 mm, preferably to not more than about 2 mm.

The channel is a channel for guiding, accommodating and/or supporting the at least one connecting body. Exactly one connecting body or a plurality of connecting bodies may be arranged in the channel, at least partially, or completely. Exactly one channel may be provided in the base body, or a plurality of channels may be provided in the base body.

Preferably, the at least one channel is arranged at a lateral side of the base body, and/or not at a lateral side, i.e. in the interior of the base body. In one specific embodiment, the at least one channel is formed as a lateral recess in the base body, and/or as a non-lateral recess in the base body. In case of a non-lateral channel, the channel is formed as a recess in the front face and/or the rear face of the base body.

In one embodiment, the at least one channel opens to the upper surface and/or to the lower surface and/or to the lateral surface of the base body. In this way, a preferably continuous communication is established between the upper surface and/or the lower surface and/or the lateral surface of the base body. In one embodiment, the channel extends from the front face, i.e. upper surface, to the rear face, i.e. lower surface, and/or provides a communication between the front face of the base body and the rear face thereof and is preferably formed as a hole.

In one embodiment of the invention, the at least one channel comprises a preferably substantially rectilinear first portion. Preferably, the first portion extends substantially along the central axis of the base body, preferably in parallel thereto. If the channel is formed preferably exclusively by a first straight portion, the channel is substantially I-shaped.

In this case, the first portion of the channel is preferably an opening or a bore in the base body. In an embodiment with a substantially I-shaped channel and when arranged in a non-lateral region of the base body, the channel has a tubular shape. It constitutes some kind of a tube having open ends. If arranged in a lateral region, however, the channel constitutes some kind of a groove or trench. In other words, it is a channel which opens to the lateral surface.

In another embodiment, the at least one channel comprises a preferably substantially rectilinear second portion, in particular additionally. This portion extends substantially transversely to the first portion of the channel, preferably perpendicular thereto.

The second portion of the channel is preferably provided as a recess in the upper surface of the base body and/or as a recess in the lower surface of the base body. It forms some kind of a groove or a channel that opens upwardly to the upper surface and/or a channel that opens downwardly to the lower surface of the base body. In a preferred embodiment of the invention, the second portion of the channel extends from the central axis of the base body towards the lateral surface of the base body, preferably radially. Here, the peripheral or lateral surface constitutes the lateral wall which connects the upper surface with the lower surface of the base body.

In one embodiment, the channel is formed by the first and second portions. In particular in this case the first portion of the channel merges into the second portion of the channel. The first portion of the channel opens into the second portion of the channel. Thereby, a substantially L-shaped channel is formed, in particular at least in sections thereof. The legs of the "L" are defined by the first and second portions. Therefore, the aforementioned first portion and the aforementioned second portion of the channel may also be referred to as first and second legs of the channel.

The channel generally has a cross-sectional area from about 0.25 mm$^2$ to about 25 mm$^2$, preferably up to about 9 mm$^2$, more preferably up to about 3 mm$^2$.

The at least one connecting body is a connecting body for providing an electrical connection for the functional element placed upon the base body. Generally, the connecting body permits to establish a connection between the upper surface of the base body and thus the functional element and the surroundings, preferably by means of a connection via the lateral surface and/or the rear face of the base body.

The connecting body is a solid body. Preferably, it may even be deformable under slight pressure, for example when being compressing with the fingers. It does not constitute a layer deposited or grown on the base body, for example by means of a PVD process.

Rather, the connecting body is placed in the channel, at least sections thereof. In a first embodiment, the connecting body is first disposed in the channel, at least sections thereof. Then, the channel is filled with the glass for joining the connecting body to the base body, at least partially.

Generally, the connecting body is electrically insulated from the base body. It is spaced apart from the base body, at least sections thereof, and/or it is separated from the base body by the glass and the glass layer which is formed. The connecting body is embedded or positioned in the glass in such a manner that at least two contact points of the connecting body are exposed, so that the connecting body may be connected, for example by means of a wire.

Preferably, the head end and the foot end of the connecting body are exposed. For contacting, a wire ("wire bonding") and/or a conductive path may be attached to the exposed area, for example. It is for example also possible to place a functional element at or upon the connecting body, and to attach it thereto, preferably by means of a conductive adhesive. A channel will have associated therewith at least one connecting body, or exactly one connecting body, or a plurality of connecting bodies.

The connecting body emerges at the upper surface and/or at the lower surface and/or at the lateral surface of the base body, and there it may be connected to other components, for example to at least one optoelectronic functional element at the upper surface. The at least one connecting body may substantially terminate at the upper surface, at the lower surface, and/or at the lateral surface of the base body, and/or may extend beyond the upper surface, the lower surface and/or the lateral surface of the base body.

Generally, the shape and/or size of the connecting body is adapted to the shape and/or dimensions of the channel to which it is associated and/or in which it is arranged, at least sections thereof. In particular, the connecting body is substantially shaped in correspondence to the shape of the channel, preferably completely, for example it may have an I-shape or an L-shape, at least in sections thereof. The connecting body may be defined by a first and/or a second portion. The first portion of the connecting body extends substantially along the central axis of the base body, preferably in parallel thereto. The second portion of the connecting body extends substantially transversely to the first portion, preferably perpendicular thereto.

Preferably, the connecting body is a contact pin.

A contact pin is an elongated metal component having a very reduced cross-section relative to the length thereof. It is a needle-shaped or nail-like component. It may comprise only one rectilinear leg, or may also have at least one bent portion. Thus, the contact pin may be provided as a substantially straight or I-shaped pin, in particular at least in sections thereof. However, it may also be provided as a hook or with an L-shape, in particular at least in sections thereof. A metallic wire is also to be understood as a contact pin.

The connecting body comprises or constitutes a metal or an alloy. The metal in this case is at least one selected from the group consisting of copper, aluminum, nickel, cobalt, iron, steel, or stainless steel, ferritic steel or stainless steel, and austenitic steel or stainless steel. The cross-sectional area of the connecting body, preferably of the contact pin, generally ranges from about 0.1 mm$^2$ to about 16 mm$^2$, preferably up to about 3 mm$^2$, more preferably up to not more than about 0.8 mm$^2$.

The glass is a glass for joining the base body to the connecting body and/or for insulating the base body from the connecting body. The glass has a softening point or a softening temperature in a region below the melting temperature of the materials used for the base body and/or the connecting body. For joining or upon joining, the glass is/has been heated until it has a viscosity at which the components adhere to each other. Upon joining, the glass preferably has a viscosity in a range from $10^7$ Pa·s to about $10^3$ Pa·s. Heating is accomplished in a furnace, for example. The employed glass preferably is or comprises a phosphate glass and/or a soft glass and/or an alkali titanium silicate glass. Examples of a phosphate glass include the glasses designated SCHOTT G018-122. Examples of a soft glass include the glasses designated SCHOTT 8061 and/or SCHOTT 8421. If for instance the base body and/or the connecting body is/are substantially provided by copper and/or aluminum, in particular at the interface to the glass, the glass is preferably an alkali titanium silicate glass. The base body and/or the connecting body and/or at least the interfaces has/have a copper or aluminum content of at least 50 wt. %, preferably of at least 80 wt. %.

In a preferred embodiment, the glass has or comprises the composition described in the tables above.

The glass layer formed by the glass, or in more detail the glass layer formed between the base body and the connecting body generally has a thickness of more than about 30 μm. In this manner a gas-tight bonding with sufficient electrical insulating properties can be provided. Preferably, the glass layer has a thickness from about 200 μm to about 2000 μm.

The electrical resistance of the glass layer that is based on an alkali titanium silicate glass, especially with the aforementioned compositions, is generally greater than 1 GΩ. Gas tightness is generally less than $1*10^{-8}$ mbar*l/s. Furthermore, the glass is distinguished by an improved strength and improved chemical resistance. For example, the shear strength in a sample body (4 mm×4 mm of glazing surface, and 100 μm of nominal thickness of the glass layer) can be increased with the glass of the invention from an average of 60 N to 105 N, as compared to the glass P8061. Furthermore, the glass according to the invention has an improved chemical resistance as compared to the glass G018-122 (see WO 2009/132838 A1). Electro-plating may be performed after vitrification.

Generally, the glass may be applied by at least one method selected from a group consisting of dispensing, providing of a preferably punched glass strip, and/or providing of an individual preform. A glass strip may for example be provided by molding slip into a strip shape. For an efficient manufacturing, the glass may be provided in an array.

For other possible embodiments of the glass layer or the glass and the methods of using a glass, reference is made to the first and/or second glass layers described in document WO 2009/132838 A1.

In order to achieve better adherence of the connecting body to the base body, the glass contacting surfaces of the base body and/or the connecting body are preferably pre-treated. In one embodiment, the pre-treatment may comprise a pre-oxidation of the glass contacting surfaces. Pre-oxidation refers to a selective oxidation of a surface, for example in an oxygen-containing atmosphere. In this case, a bonding between glass and copper or copper oxide has proved to be very stable. The metal, preferably copper, is selectively oxidized in an oxygen-containing atmosphere. In terms of oxide weight, a mass per unit area from about 0.02 to about 0.25 mg/cm$^2$, preferably from about 0.067 to about 0.13 mg/cm$^2$, has proved to be advantageous for the oxide weight. The oxide adheres well and does not flake. This is particularly true when the copper is provided in a proportion of more than 50 wt. %, preferably more than 80 wt. %, in the base body and/or in the connecting body and/or at least at the interfaces.

To improve the properties of the base body and/or the connecting body, for example reflectivity, bondability and/or electrical conductivity, these bodies may be coated and/or covered, preferably at least partially, preferably with a metal. One possible method is plating, preferably electro-plating.

The optoelectronic functional element that can be positioned upon the base body, is a radiation emitting and/or radiation receiving component. Preferably, it is formed as a chip. The functional element is at least one component selected from the group of LED, photodiode, and laser diode. The housing according to the invention is particularly suitable to be used for high-power LEDs, preferably of a power of more than about 5 W, since such components require efficient heat dissipation and the housing must be sufficiently heat resistant. The housing of the invention may in particular also be useful for non-optoelectronic functional elements, such as power semiconductors, which require sufficient thermal stability when employed. Thus, the housing of the invention may also be a housing for an optoelectronic functional element and/or more generally for a functional element. The same applies to the method according to the invention.

In another embodiment, the invention distinguishes in that at least the upper surface of the base body has at least one depression with a bottom. The mounting area for at least one optoelectronic functional element is provided by the bottom of the depression. A functional element disposed in the depression will be better protected than a functional element placed on a flat upper surface. Preferably, an inner surface of the depression has reflecting properties, at least sections thereof, so that the depression forms a reflector for the radiation emitted and/or to be received by an optoelectronic functional element. In a preferred embodiment, the depression has a diameter that increases starting from the bottom of the depression onto which at least one optoelectronic functional element is positionable, towards the upper side of the depression. Preferably, the depression is at least partly formed as a truncated cone and/or as a truncated pyramid, with the bottom of the depression forming the base of the truncated cone and/or the truncated pyramid. The depression may be defined by a base surface, which is referred to as the bottom herein, a top face, and a circumferential surface, generally referred to as lateral surface herein. Generally, in a plan view of the upper surface of the base body, the depression has a surface area from about 4 mm$^2$ to about 50 mm$^2$, preferably up to about 20 mm$^2$. The depth usually ranges from about 0.2 mm to about 2 mm.

In one embodiment of the invention, the at least one channel opens into the at least one depression, in particular into a lateral surface of the depression. This type of arrangement provides spatial proximity of the connecting body to the functional element, which may result in a reduced sensitivity to noise.

In one embodiment, the housing of the invention has an accommodating area for receiving and supporting an end element, such as an optical component, in the upper surface of the base body. Optionally, at least one preferably transparent end element is applied to the upper surface of the base body and here preferably in the accommodating area. In particular, the end element is an optical component. One example of the optical component is a focusing component, preferably a lens. The lens may be provided by a preferably convex glass lens and/or by a drop, such as a silicone drop.

Depending on the requirements, the housing according to the invention may be designed differently: for example, the base body may have one depression and one channel or two channels. However, it is also possible for the base body to have a plurality of channels and/or a plurality of depressions.

Some embodiments that are based on a plurality of channels and/or a plurality of depressions in the base body will be described below:

In a first embodiment, at least some of the plurality of channels and/or at least some of the plurality of depressions, at least portions thereof, are distributed around the mounting area, for example in a circle. Preferably, adjacent channels and/or depressions are disposed substantially equidistantly from one another. In a second embodiment, one channel out of the plurality of channels and/or one depression out of the plurality of depressions is arranged at the central axis of the base body, and the remaining channels of the plurality of channels and/or the remaining depressions of the plurality of depressions are distributed around the central axis of the base body.

Since each functional element generally requires a pair of connections for being operated, another embodiment of the housing is distinguished in that the channels of the plurality of channels are at least partly arranged in pairs. Preferably, each depression of the plurality of depressions has associated therewith at least one pair of channels.

In another embodiment of the housing, an insulation is applied at least to the lower surface thereof. To this end, an insulation is provided on the lower surface of the base body and optionally on the lower surface of the at least one connecting body, which insulation is preferably provided by an insulating layer. The insulation may be continuous or segmented. The insulation material preferably is or comprises a glass and/or a ceramic material. The layer may be applied, for example, by enamelling and/or by a cold spray process. This permits to keep the lower surface of the housing electrically floating.

In another embodiment of the housing, a sleeve is arranged at the lateral side of the base body. The sleeve or sheath extends around the circumferential surface of the base body, at least around sections thereof. The sleeve is preferably attached to the base body by means of a glass layer. The glass layer is disposed between the base body and the sleeve. Preferably, the sleeve is provided as a metallic sleeve, for example of stainless steel. This permits to provide the outer surface of the housing at a defined potential, for example ground or zero potential.

The base body and in particular also the channels arranged at and/or in the base body and/or the connecting body are produced by a lead frame process. Examples of such a manufacturing technique include photochemical etching, stamping, laser cutting, and/or water jet cutting. Punching is very cost effective and therefore it is the preferred technique for producing the aforementioned components. Therefore, one preferred embodiment of the invention essentially uses only punchable metals for producing the base body with the at least one channel and/or the connecting body. In one embodiment, a plate is patterned in a manner such that a multitude of components is produced per plate. The housing is part of an array of individual housings. Thus, an array is some kind of a basic body in which the respective components are integrated or arranged. Therefore, likewise within the scope of the present invention is an arrangement or an array which comprises a plurality of housings, preferably of the housings described above. The individual housings are attached to the respective array by webs or connecting webs. Therefore, the invention may likewise be described by a method for producing a plurality of optoelectronic functional element housings. After manufacturing thereof, the housings are separated from the array.

Furthermore within the scope of the invention is an optoelectronic component comprising a housing according to the invention and at least one radiation emitting and/or radiation receiving optoelectronic functional element, in particular an LED, which is arranged in the housing.

Also within the scope of the present invention is an illumination device, for example an interior lighting and/or exterior lighting, which comprises at least one housing and/or one optoelectronic component according to the present invention, in particular for use in a vehicle and/or an aircraft and/or as an airfield lighting. Examples of the illumination device include a seat lighting; a reading light; a work light that may especially be integrated in ceilings or walls; an object lighting in furniture and/or buildings; a headlamp and/or rear light, and/or interior lighting, and/or an instrument or display lighting, preferably in motor vehicles; a backlight for LCD displays; a UV light, preferably in medical and/or water purification applications; and/ or a lighting for harsh environments such as when exposed to moisture and/or aggressive gas and/or radiation.

BRIEF DECSRIPTION OF THE DRAWINGS

The present invention will now be explained in detail by way of the following exemplary embodiments. For this purpose, reference is made to the accompanying drawings. The same reference numerals in the various drawings designate the same parts.

FIGS. 1.*a* to 1.*d* illustrate an embodiment of a three-layered housing, in a perspective view of the upper surface (FIG. 1.*a*), a plan view of the upper surface (FIG. 1.*b*), and in a cross-sectional view taken along the longitudinal axis A-A (FIGS. 1.*c* and 1.*d*).

FIGS. 2.*a* to 2.*c* illustrate an embodiment of a one-layered housing comprising a connecting body mounted at the lateral side of the base body, in a plan view of the upper surface (FIG. 2.*a*), in a cross-sectional view (FIG. 2.*b*), and in a cross-sectional view with an end element superposed (FIG. 2.*c*).

FIGS. 3.*a* to 3.*c* show another embodiment of a one-layered housing, in a perspective view (FIG. 3.*a*), in a cross-sectional view (FIG. 3.*b*), and in a plan view of the upper surface (FIG. 3.*c*).

FIGS. 4.*a* to 4.*c* show a modified embodiment of a one-layered housing, in a perspective view (FIG. 4.*a*), in a cross-sectional view (FIG. 4.*b*), and in a plan view of the upper surface (FIG. 4.*c*).

FIGS. 5.*a* to 5.*c* illustrate a first embodiment of a one-layered housing with a single pin contact, in a perspective view of the lower surface (FIG. 5.*a*), a plan view of the lower surface (FIG. 5.*b*), and in a cross-sectional view (FIG. 5.*c*).

FIGS. 6.*a* to 6.*c* illustrate a second embodiment of a one-layered housing with a single pin contact, in a perspective view of the lower surface (FIG. 6.*a*), a plan view of the lower surface (FIG. 6.*b*), and in a cross-sectional view (FIG. 6.*c*).

FIGS. 7.*a* to 7.*c* illustrate a third embodiment of a one-layered housing with a single pin contact, in a perspective view of the lower surface (FIG. 7.*a*), a plan view of the lower surface (FIG. 7.*b*), and in a cross-sectional view (FIG. 7.*c*).

FIGS. 8.*a* to 8.*c* illustrate a fourth embodiment of a one-layered housing with a single pin contact, in a perspective view of the upper surface (FIG. 8.*a*), a plan view of the upper surface (FIG. 8.*b*), and in a cross-sectional view (FIG. 8.*c*).

FIGS. 9.*a* to 9.*d* illustrate a first embodiment of a one-layered housing with a plurality of pin contacts, in a perspective view of the lower surface (FIG. 9.*a*) and of the upper surface (FIG. 9.*d*), a plan view of the lower surface (FIG. 9.*b*), and in a cross-sectional view along axis A-A (FIG. 9.*c*).

FIGS. 10.*a* to 10*e* illustrate a second embodiment of a one-layered housing with a plurality of pin contacts, in a perspective view of the lower surface (FIG. 10.*a*) and of the upper surface (FIG. 10.*d*), a plan view of the lower surface (FIG. 10.*b*) and of the upper surface (FIG. 10.*e*), and in a cross-sectional view along axis A-A (FIG. 10.*c*).

FIGS. 11.*a* to 11.*e* illustrate a third embodiment of a one-layered housing with a plurality of pin contacts, in a perspective view of the lower surface (FIG. 11.*a*) and of the upper surface (FIG. 11.*d*), a plan view of the lower surface (FIG. 11.*b*) and of the upper surface (FIG. 11.*e*), and in a cross-sectional view along axis A-A (FIG. 11.*c*).

FIGS. 12.*a* and 12.*b* illuistrate a fourth embodiment of a one-layered housing with a plurality of pin contacts, in a plan view of the upper surface without (FIG. 12.*a*) and with (FIG. 12.*b*) an external conductor disposed around the lateral surface.

FIGS. 13*a* to 13.*f* illustrate some embodiments of a one-layered housing of the invention, in each case with one functional element placed in the housing.

FIGS. 14*a* to 14.*f* illustrate some embodiments of a one-layered housing of the invention, in each case with two functional elements placed in the housing.

DETAILED DESCRIPTION OF THE INVENTION

FIGS. 1.*a* to 1.*d* show a first embodiment of a 3-layered or at least 3-layered housing 100. Housing 100 comprises at least a base body 10, at least or exactly two connecting bodies 30, and a head portion 70. Base body 10 and head portion 70 are joined to each other by a material bond via a glass layer 20.

The two connecting bodies 30 illustrated are disposed between base body 10 and head portion 70. Specifically, they are disposed within the glass layer 20. The glass layer 20 may also be implemented by two separate glass layers, with the two connecting bodies 30 placed between the two layers in this case. In this manner, the two connecting bodies 30 are electrically insulated from both the base body 10, and the head portion 70. The two connecting bodies 30 extend through glass layer 20. They provide an electrical connection or two electrical terminals between the interior and the exterior of the housing 100. The at least two or two connecting bodies 30 are positioned both on one side of housing 100, or on the same side of housing 100. They are arranged in a plane. In the present example, the connecting bodies 30 are two metallic plates, preferably copper plates. They may be bent or are bent, as illustrated, so that for example a connection may be established to a conductor trace of a circuit board to which the housing 100 will be placed when operated.

Base body 10 has an upper surface 10*a*, a lower surface 10*b*, and a lateral surface 13. In the example shown, the base body 10 has a polygonal, preferably square, cross section. The cross section may also be round, preferably circular or oval. Base body 10 is likewise implemented as a metal plate, preferably as a copper plate. At the upper surface 10*a* of base body 10, a mounting area 14 is defined for at least one electronic functional element 40, such as a power electronics device. One example is a FET. Mounting area 14 is provided by the upper surface 10*a* of base body 10.

Head portion 70 is arranged upon base body 10, specifically on the upper surface 10*a* of base body 10. It has substantially the same dimensions as base body 10. Head portion 70 is in particular implemented as a metal plate, preferably as a copper plate. Head portion 70 covers base body 10 in sections thereof. However, it does not necessarily form and end of housing 100 at the upper surface thereof. In particular, it forms at least a portion of a housing wall or the housing wall. Head portion 70 may also be referred to as a housing wall or frame. Head portion 70 surrounds the mounting area 14, in particular at least partially, or completely. Thus, an opening 71 or hole 71 is formed in head portion 70. The functional element 40 to be mounted is then placed in the hole 71, or within head portion 70. The opening 71 has a polygonal, preferably a square cross section. The cross section may also be round, preferably circular, or oval. Head portion 70 may constitute some kind of a cover for base body 10. It is also possible to additionally provide a lid on head portion 70, for closing the housing 100.

Glass layer 20 is disposed between the upper surface 10a of base body 10 and head portion 70. It joins base body 10 to head portion 70. The glass is an alkali titanium silicate glass. Here, the thickness of the glass layer is from about 30 μm to about 500 μm, preferably from about 100 μm to about 300 μm.

FIG. 1.d shows the same embodiment as in FIG. 1.c. In addition, an insulation 15, in particular an insulating layer 15 is applied to the lower surface 10b of base body 10 and optionally to the lower surface of connecting body 30. In the example shown, the lower surface 10b of base body 10 is completely or substantially completely covered by insulation 15. The metallic components, in this case only the lower surface 10b of base body 10, are covered by insulation 15. In this manner, the lower surface of housing 100 may be kept electrically floating.

In the embodiment described above, base body 10 and connecting body/bodies 30 are joined by a glass layer 20 which is substantially disposed on the upper surface 10a of base body 10. In contrast, the embodiments described below illustrate a housing 100, in which the base body 10 and the connecting body 30 are joined by a glass layer 20 that is disposed between the circumferential or lateral surface 13 of base body 10 and the connecting body 30. Connecting body 30 is attached at the lateral side or lateral surface of base body 10. The glass is again an alkali titanium silicate glass. The thickness of the glass layer ranges from about 200 μm to about 2000 μm.

FIGS. 2.a to 2.c show an embodiment of a housing 100 with a connecting body 30 secured to the lateral surface 13 of base body 10. Connecting body 30 is implemented as a contact pin 30, by way of example. In this variation of the housing 100, glass layer 20 is disposed on lateral surface 13. Glass layer 20 only covers sections of lateral surface 13. Base body 10 extends downwards beyond glass layer 20. The contact pin or connecting body 30 is disposed in or inside glass layer 20, or is embedded therein, at least partially. It has a length that is larger than the height of glass layer 20. In an upper portion, connecting body 30 is completely surrounded by glass layer 20 around its circumferential surface. In a lower portion by contrast, connecting body 30 is completely exposed. On the outer surface of glass layer 20, a tubular portion or sleeve 16 is positioned. Sleeve 16 extends completely around the circumferential surface of glass layer 20, or around the circumference of housing 100. Sleeve 16 is preferably a metallic sleeve, for example of stainless steel. In this manner it is possible to keep the outer surface of housing 100 electrically floating. Sleeve 16 forms a potential-free outer conductor, or a shield.

In the cross-sectional view it can be seen that some kind of an I-shaped glass composite is formed. A kind of ring-in-ring system is formed around base body 10. Here, the bonding glass layer 20 defines a first ring, and sleeve 16 defines a second ring. Both, they are arranged around base body 10. Here, glass layer 20 and sleeve 16 extend completely and/or continuously around the circumference of base body 10. By way of example, housing 100 has a round cross section herein, in particular an oval one. However, the cross section may likewise be generally round, or may be polygonal.

FIG. 2.c corresponds to FIG. 2.b. Additionally, however, a lens is disposed above the upper surface 10a of base body 10, as an end element 60. The lens is secured spaced apart from the upper surface 10a of base body 10 by means of a holder 61. Holder 61 is provided, for example, by a further tubular portion or a further sleeve. Here, holder 61 is placed upon the upper surface of sleeve 16. This embodiment is particularly suitable for an LED as a functional element 40. Functional element 40 is connected to connecting body 30 via bonding wire 50. Connecting body 30 provides a first terminal. A second terminal is provided by base body 10.

FIGS. 3.a to 3.c show a modified embodiment to that of FIGS. 2.a to 2.c, of a one-layered housing 100. First, the cross section of housing 100 is not oval but circular. Moreover, base body 10 and connecting body 30 do no longer terminate at the upper surface of sleeve 16 and the upper surface of glass layer 20. Rather, base body 10 and connecting body 30 extend upwardly and downwardly along the longitudinal axis of housing 100 beyond sleeve 16 and beyond glass layer 20. As a result, they are easily contacted. FIG. 3.c shows a view of the upper surface of housing 100 without components 60 and 61. Base body 10 and/or connecting body 30 extend beyond the lower surface of sleeve 16 by about 1 mm to about 10 mm, preferably by not more than about 5 mm. Preferably, the height and/or diameter of sleeve 16 ranges from about 3 mm to about 10 mm.

FIGS. 4.a to 4.c show another modified embodiment of a one-layered housing 100. In this embodiment, two connecting bodies 30 are provided. In combination with base body 10, this allows to separately drive two LEDs 40, for example. Base body 10 and the two connecting bodies 30 extend upwardly beyond glass layer 20, but terminate with sleeve 16. Base body 10 consists of two parts in this example. It is provided by an upper body and a lower body. Between the lower body or portion of base body 10 and the two connecting bodies 30, a further insulation 23 is provided, for example of glass.

The housings 100 shown in FIGS. 2.a through 4.c are particularly suitable for plug socket applications. For being connected, the downwardly extending base body 10 and the downwardly extending connecting body/bodies 30 may simply be plugged into a socket which provides the power supply, for example. This is for instance useful for an application of an LED as a lamp.

With reference to the subsequent drawings of FIGS. 5.a to 14.f, exemplary embodiments of a housing according to the invention will be described in detail.

All of these figures illustrate a connecting body 30' which is implemented as a contact pin 30'. First, FIGS. 5.a to 5.c show a first embodiment of a one-layered housing 10' including a single channel 11' in which a single contact pin 30' is disposed.

The base body 10' is a metal plate, in a preferred embodiment a copper plate. At the upper surface 10a' of base body 10' the mounting area 14' for an optoelectronic functional element 40' is defined. Here, it is provided by a planar or substantially planar upper surface 10a'.

Especially in order to keep the production costs low, base body 10' with channel 11' formed therein is made by a stamping process. In this example, channel 11' formed therein comprises a first portion 11-1' and a second portion 11-2'.

The first portion 11-1' is formed as a non-lateral recess 13', in the present case as a bore or through-hole in base body 10'. The first portion 11-1' of channel 11' extends from the upper surface 10a' of base body 10' to the rear face 10b' of base body 10'. It forms some kind of a tube in base body 10'. Here, the first portion 11-1' extends substantially in parallel to the central axis 10d' of base body 10'.

The second portion 11-2' of channel 11' extends transversely to the first portion 11-1' of channel 11', in the present case perpendicular thereto. The second portion 11-2' also extends transversely to the central axis 10d' of base body 10', here perpendicular thereto.

The second portion 11-2' is formed as a recess in the rear face 10b' of base body 10'. The recess extends from central axis 10d' of base body 10' towards the lateral surface 10c' of base body 10'. It forms some kind of a downwardly opening channel 11' in base body 10'. Second portion 11-2' opens into lateral surface 10c' of base body 10'.

In the present embodiment, channel 11' is formed by first portion 11-1' and second portion 11-2'. First portion 11-1' of channel 11' merges into second portion 11-2' of channel 11'. In a cross-sectional view, channel 11' is substantially L-shaped (see FIG. 5.c).

In this example, channel 11' or first 11-1' and second 11-2' portions of channel 11' is/are substantially completely filled with a glass 20'. Glass 20' serves to join base body 10' to connecting body 30'. Glass 20' is an alkali titanium silicate glass. Contact pin 30' is disposed in channel 11' and is embedded in the glass 20'.

In a first method step, initially, base body 10' is provided with channel 11' or 11-1' and 11-2' formed therein. In one embodiment of the method, channel 11' or 11-1' and 11-2' is first filled with the glass 20' which preferably is in a liquid or low-viscosity state. For this purpose, glass 20' is in an appropriately heated state. For the present glass 20' this is at a temperature in a range from about 400° C. to about 1000° C., preferably from 500° C. to about 700° C. One example of filling is dispensing. Once channel 11' or 11-1' and 11-2' is/are filled, the contact pin 30' is inserted or pressed into the filled channel 11' or 11-1' and 11-2', in this case via the rear face 10b' of base body 10'.

The dimensions and shape of contact pin 30' are adapted to the dimensions and shape of the channel 11' in which it is placed. In the example shown, contact pin 30' is also substantially L-shaped, and thus also has a first portion 30-1' and a second portion 30-2'. Contact pin 30' has a hook shape.

The first portion 30-1' of contact pin 30' is associated with the zone of the first portion 11-1' of channel 11'. The second portion 30-2' of the contact pin 30' is associated with the zone of the second portion 11-2' of channel 11'. The first portion 30-1' is substantially completely surrounded by the glass 20', except for its end face 30a'. This free end face 30a' terminates at the upper surface 10a' of base body 10'. It provides the terminal for optoelectronic functional element 40'. The free end face 30a' may also be located above the upper surface 10a'.

The second portion 30-2', by contrast, is not completely enclosed by the glass 20', in the example shown. This is because on the one hand the second portion 30-2' does not terminate at lateral surface 10c' of base body 10'. Rather, it extends beyond the lateral surface 10c' of base body 10'. Thus, contact pin 30' may for example be deflected appropriately to reach a connection element. Therefore, the end face 30b' of second portion 30-2' is also exposed. On the other hand, in addition thereto, the second portion 30-2' is not completely immersed in the glass 20' in the region of base body 10'. The rear side of the circumferential surface 30c' of the second portion 30-2' is exposed above the glass 20'. This additionally allows for back side contacting by simple placement onto a conductor trace (see FIG. 13.d).

In order to avoid repetitions, only the respective modifications will be described for the embodiments explained below. For identical or similar features, reference is made to the respective embodiments described above.

FIGS. 6.a to 6.c show a second embodiment of the present invention. As an alteration when compared to the first embodiment of the invention shown in FIGS. 5.a to 5.c, the upper surface 10a' of base body 10' now has a depression 15', for example provided by a recess 15'. The functional element 40' may now be placed in the depression 15' to be protected therein. In this example, depression 15' has a round, preferably circular cross section. The functional element 40' is arranged at the bottom of depression 15' and in particular in the center of depression 15'. The diameter of depression 15' increases, preferably continuously, starting from the bottom of depression 15' towards the upper side thereof. Depression 15' has a shape of a truncated cone.

If the functional element 40' is implemented as an LED 40', for example, the inner surface or lateral surface of depression 15' may have reflective properties, in particular at least in sections thereof, to improve illumination. Therefore, depression 15' may also be referred to as a reflector 15'. Depending on the material and/or manner of manufacturing, depression 15' or the inner surface of depression 15' may already have sufficiently good reflective properties. Usually, however, reworking of the inner surface or lateral surface of depression 15' will be required. One way to achieve the reflective properties is by machining the inner surface, for example by polishing. As an alternative or in addition thereto, the inner surface may also be coated and/or covered, in sections thereof or completely, preferably with a metal.

The material for producing the coating and/or lining, preferably the metal, is at least one material selected from a group consisting of silver, aluminum, nickel, palladium, and gold. The method for generating or producing the coating is at least one method selected from a group consisting of electro-plating, and vapor deposition, in particular PVD and/or CVD.

FIGS. 7.a to 7.c show a third embodiment of the invention. As a modification to the embodiment shown in FIGS. 6.a to 6.c, the depression 15' now has a polygonal cross-section. Illustrated is a depression 15' having a rectangular, preferably square cross section. Depression 15' has a shape of a truncated pyramid.

Furthermore, FIGS. 8.a to 8.c illustrate a fourth embodiment of a one-layered housing 10'. What has changed is that the base body 10' is no longer "just" rectangular, but square. The depression 15' is arranged concentrically in the base body 10', or coaxially to the central axis 10d' of base body 10'. Moreover, contact pin 30' is no longer formed as a hook, but now is formed as a straight or needle-like pin. It is defined by only a first, rectilinear portion 30-1'. It forms a contact pin 30' having a single leg 30-1' without a leg 30-2' extending transversely thereto. Furthermore, contact pin 30' is no longer arranged in the lateral region of base body 10'. It is now arranged in the region of the lateral surface of depression 15'. For this purpose, channel 11' is provided in the lateral surface of depression 15'. Channel 11' opens into the lateral surface of depression 15'. Channel 11' provides a communication between the front face 10a' of base body 10' and the rear face 10b' thereof. In the illustrated example, channel 11' extends perpendicular to the back face 10b' of base body 10' and in parallel to the central axis 10d' of base body 10'. This positioning of channel 11' provides for spatial proximity of contact pin 30' to the functional element 40'. For example, it is no longer necessary to lay a wire 50' along the upper surface 10a' of base body 10'.

Contact pin 30' is arranged within channel 11', or 11-1'. It is disposed substantially in the center of channel 11-1'. It is fixed at or in base body 10', or at or in channel 11' by means of a glass layer 20'. Channel 11' is filled with the glass 20' for providing the bonding glass layer 20' only to such an extent that the interior of channel 11-1' above the bottom of the depression 15' is substantially free of glass 20'. In this manner the glass 20' can be prevented from flowing into the depression 15'.

In addition, an accommodating area 16' for an optical component 60' is provided in the upper surface 10a' of base body 10'. The optical component 60' is for example a lens 60', in particular a glass lens 60'. The accommodating area 16' is formed as a further depression in the upper surface 10a' of base body 10'. This further depression has a larger cross section than that of the upper face of reflector 15', and has a depth from about 0.1 to 1 mm, to give an example.

In summary, FIGS. 5.a through 8.c described above illustrate embodiments of the invention having only a single contact pin 30' and a single depression 15' in base body 10'. In contrast, the embodiments of the invention shown in FIGS. 9.a to 12b and described below illustrate a base body 10' having a plurality of contact pins 30', and some of them additionally having a plurality of depressions or reflectors 15'.

First, FIGS. 9.a to 9.d illustrate a first embodiment without depression or reflector 15'. A single functional element 40' or a plurality of functional elements 40' may be disposed on the upper surface 10a' of base body 10'. However, since a plurality of channels 11' and contact pins 30' are provided, a plurality of functional elements 40' will usually be placed on upper surface 10a'.

The base body 10' is substantially round, preferably circular. The circle is defined or approximated by a polygon. In the version shown, the lateral surface 10c' or contour of base body 10' is not formed by a curved line but by a 12-edged polygon (see FIG. 9.a).

Channels 11' and contact pins 30' are distributed along the periphery of mounting area 14'. They are not arranged at the lateral surface 10c' or edge of base body 10'. Rather, they are offset inwardly, i.e. towards the center of base body 10'. They are arranged along a circumference of a circle in base body 10'. Preferably, they are arranged equidistantly from one another around the circumference of a circle. In the example shown, twelve channels 11' and twelve contact pins 30' are arranged in base body 10'.

As already shown above in FIGS. 8.a to 8.c, channels 11' and contact pins 30' again only have a first, straight portion, 11-1' and 30-1'. For each contact pin 30' one respective channel 11' is provided, which is formed as an opening in base body 10'. Each contact pin 30' has associated therewith one single channel 11'. The channel 11' provides a communication between the front face 10a' and the rear face 10b' of base body 10'. Channel 11' is filled with the glass to form glass layer 20'. Contact pin 30' is arranged inside the glass 20' and preferably in the center of channel 11'. The contact pin 30' is electrically insulated from base body 10' by the glass layer 20'. In the simplest case, a contact pin 30' may be inserted into a channel 11' filled with glass 20'. For example, a functional element 40' having back side contacts may be placed upon the channel 11' and the end face 30a' of contact pin 30' which is exposed there (for this, see FIG. 13.f). Channels 11' constitute non-lateral channels 13'.

FIGS. 10.a to 10.e illustrate a second variation of a one-layered housing 10' having a plurality of channels 11' and a plurality of contact pins 30'. In contrast to the first variation illustrated in FIGS. 9.a to 9.d, both the channels 11' and contact pins 30' are hook-shaped or L-shaped. A first portion 30-1' or leg of the hook extends substantially in parallel to the central axis 10d' of base body 10'. A second portion 30-2' or leg of the hook extends substantially transversely to the first portion 30-1' of the hook, in the present case perpendicular thereto. This second portion 30-2' extends radially outwards. The channels 11' and contact pins 30' are arranged or placed in or at base body 10' substantially similar to the embodiment shown in FIGS. 5.a to 5.c. The plurality of channels 11' and contact pins 30' are distributed around the circumference of base body 10'.

In contrast thereto, the second portions 30-2' of contact pins 30' do not extend beyond the lateral surface 10c' of the base body 10'. They terminate at the lateral surface 10c' of base body 10'. Moreover, not all channels 11' and contact pins 30' are of equal length. In the example shown, six short channels 11' and six short contact pins 30', and one long channel 11' and one long contact pin 30' are arranged at or in base body 10'.

The short contact pins 30', or the contact pins 30' having a short second portion 30-2' are disposed along the circumference of base body 10' substantially equidistantly from one another. The long contact pin 30', by contrast, has an enlarged second portion 30-2'. It terminates, with its first portion 30-1', in the center or at the central axis 10d' at the upper surface 10a' of base body 10'.

This arrangement may for example be used to drive six LEDs 40' arranged upon the mounting area. The six LEDs 40' have one common terminal, for example the central contact pin 30', as an anode or cathode. However, they each have a separate terminal as the cathode or anode, for example a respective one of the six short contact pins 30' distributed around the circumference, so that the six LEDs 40' can be switched on and off separately.

FIGS. 11.a to 11.e show a third embodiment of a one-layered housing 10' having a plurality of channels 11' and a plurality of contact pins 30'. The base body 10' has a plurality of reflectors 15', here six reflectors 15', by way of example. They are arranged around the central axis 10d' of base body 10'. Furthermore, the base body 10' has twelve channels 11' and twelve contact pins 30' which are substantially similar the short channels 11' and short contact pins 30' shown in FIGS. 10.a to 10.e. In contrast thereto, however, they are arranged in pairs in this case. Each pair of two channels 11' with two contact pins 30' has associated therewith one reflector 15'. Given these two terminals per reflector 15', one anode and one cathode may be associated with each reflector 15' or with one or a plurality of functional element(s) 40' positioned in the reflector 15'.

FIGS. 12.a and 12.b illustrate a fourth embodiment of a one-layered housing 10' having a plurality of channels 11' and a plurality of contact pins 30'. Here, by way example, contact pins 30' do not have a round or circular cross section, but an angular cross section, rectangular in this case.

Channels 11' and contact pins 30' are distributed along the circumference of base body 10', preferably substantially equidistantly to one another. Channels 11' and contact pins 30' are only defined by a first, straight section, 11-1' and 30-1'. They are each substantially I-shaped. In contrast to the embodiments shown above, channels 11' or first portions 11-1' thereof are not arranged in the interior of base body 10' (non-lateral), but are arranged at the lateral side of base body 10' in this case. They constitute lateral channels 12'. The surface 30c' of contact pins 30' facing outwards is exposed here.

FIG. 12.b shows the same embodiment as in FIG. 12.a. Additionally, however, a sleeve 36' is disposed around the lateral surface 10c' of base body 10'. Preferably, sleeve 36' is a metallic sleeve, for example of stainless steel. This makes it possible to keep the outer surface of the housing 100' electrically floating. A potential-free outer conductor or shield is provided.

It can be seen in the cross-sectional view that some kind of a ring-in-ring system is formed around base body 10'. Here, a bonding glass layer 35' defines a first ring, and sleeve 36' defines a second ring. Both, they are arranged around base body 10'. Here, glass layer 35' and sleeve 36' extend completely and/or continuously around the circumference of base body 10'. The cross section of base body 10' or housing 100' is illustrated herein within a polygonal shape, by way of example. The cross section may likewise be round.

To give a first summary, the above described FIGS. 5.a through 12.b illustrate embodiments of the invention in which only the housing 10' is shown, which is here provided by base body 10', without a functional element 40' placed thereupon or therein.

By contrast, FIGS. 13.a through 14.f described below illustrate different variations of how one functional element 40' (FIGS. 13.a to 13.f) or a plurality of functional elements 40' (FIGS. 14.a to 14.f) may be connected.

After having been installed in the housing 10' or placed upon the base body 10', the functional element 40' is in direct contact with the base body 10'. The upper surface 10a' of base body 10' or of the reflector 15' is usually substantially planar. The functional element 40' may, for example, be adhered or soldered to the base body 10'. Preferred solders that are used include lead-free soft solders. The adhesive is preferably a conductive adhesive, such as an epoxy enriched with silver. Therefore, direct contact also means a contact via an adhesive, a solder, or a binding agent.

The form of contact pins 30' chosen herein corresponds to the contact pins 30' illustrated in FIGS. 9.a to 9.d, by way of example.

First, FIGS. 13.a to 13.f illustrate some applications of a housing 10' according to the invention, with a single functional element 40' placed upon base body 10' or in the housing 10'.

FIG. 13.a shows a housing 10' or base body 10' having a single channel 11' and a single contact pin 30' placed therein. The functional element 40', such as an LED, may be contacted via two terminals, namely anode and cathode, on its front face. Functional element 40' is connected by a wire 50' with the leads or terminals of housing 10' (so-called wire-bonding). A first terminal is provided by contact pin 30'. A second terminal is provided by the base body 10' itself, which is a metallic base body 10' in the present case.

FIG. 13.b shows the embodiment illustrated in FIG. 13.a with a lens 60' applied to base body 10' as an end element. Lens 60' is provided, for example, by applying a drop of a material that is transparent in the emitting range of the LED, such as silicone.

FIG. 13.c shows an embodiment of a housing 10' with a lens 60' applied to the base body 10' as an end element. Lens 60' is provided, for example, by a glass lens. The latter is fixed to base body 10' in spaced apart relationship to the upper surface 10a' by means of a holder 61'. Holder 61' may be provided, for example, by some kind of a bracket or tubular portion. The functional element 40' shown herein may be connected via its front face and its rear face. A first terminal is formed by a lateral contact pin 30'. A second terminal is provided by the base body 10' itself. Additionally, a sleeve 36' is positioned at the lateral surface 10c' of base body 10'. Base body 10' is enclosed by sleeve 36' which is fixed to the base body 10' by means of glass layer 35'. For further details, reference is made to the description of FIG. 12.b.

FIG. 13.d shows an embodiment of a housing 10' having a plurality of contact pins 30', in this case two, in the base body 10'. The terminals are provided by the two contact pins 30'.

As an enhancement to FIG. 13.d, FIG. 13.e shows an embodiment of a housing 10', which additionally has an insulation 17', in particular an insulating layer 17', applied to the lower surface 10b' of base body 10'. Insulation 17' is segmented. Lower surface 10b' of base body 10' is completely or substantially completely covered by insulation 17', with the exception of the two channels 11'. This allows the lower surface 10b' of housing 10' to be kept electrically floating. This embodiment is particularly suitable in case the base body 10' is used as a terminal for the functional element 40' and therefore is an electrically live component.

If a sufficient number of connecting bodies 30' is provided for driving a functional element 40' or a plurality of functional elements 40', then the lower surface 10b' of base body 10' may be kept electrically floating, by using the base body 10' exclusively as a support, and by using the connecting bodies to provide the terminals. This is for example true for the housings 10' shown in FIGS. 9.a to 12.a.

While FIGS. 13.a to 13.e illustrate an embodiment of a functional element 40' which is only connectable via its front face, FIG. 13.f shows an embodiment in which the functional element 40' is contactable via its front face and its rear face.

The embodiment illustrated in FIG. 13.f partly corresponds to the embodiment illustrated in FIG. 13.a. A first terminal is provided by a lateral contact pin 30'. A second terminal is provided by a contact pin 30' preferably mounted in the center. The functional element 40' is placed with its lower surface upon the first end face 30a' of contact pin 30' and is contacted in this way.

Finally, FIGS. 14.a to 14.f illustrate some so-called multi-chip applications with a plurality of functional elements 40' placed on base body 10'. For the sake of clarity, only two functional elements 40' are illustrated in the figures, by way of example.

First, FIG. 14.a' shows an embodiment in which two functional elements 40' are arranged in one reflector 15'. Reflector 15' herein has associated therewith two contact pins 30'. The two contact pins 30' provide two common terminals for the two functional elements 40'. For example, the two functional elements 40' share an anode and a cathode. One contact pin 30' provides the common cathode, and the other contact pin 30' provides the common anode.

FIG. 14.b shows an embodiment which partially corresponds to the configuration shown in FIGS. 11.a to 11.d. Here, each functional element 40' has associated therewith two contact pins 30'. Each functional element 40' has its own or separate anode and its own or separate cathode. Combinations are also possible, in which for example each functional element 40' has associated therewith one contact pin 30', and a single contact pin 30' has associated therewith all functional elements 40'. In this variation, the functional elements 40' may for example share a common anode or cathode, while an individual cathode or anode is provided for each functional element 40'. In both variations the individual functional elements 40' may be controlled independently of one another.

FIG. 14.c shows an embodiment of the invention in which a plurality of contact pins 30' is provided for each channel 11'. A number of contact pins 30', two in this case, share one channel 11'. Contact pins 30' are embedded in the glass 20' within the channel 11' in a manner to be not in contact to each other nor to the base body 10', i.e. to be electrically insulated. Such a configuration is distinguished by a high packing density.

FIG. 14.*d* illustrates an embodiment in which a plate, such as a glass plate, is applied as an end element 60' or cover 60' upon housing 10'. Wires 50' which are depressed by the plate are only partially illustrated in the figure. The plate may be fixed by means of clamps and/or by gluing and/or by soldering, for example. It is likewise possible to place a glass lens 60' upon housing 10', as an end element 60'.

Finally, FIGS. 14.*e* and 14.*f* show a version of the invention, in which a plurality of reflectors 15' are provided in the base body 10'. One functional element 40' is arranged in each reflector 15'. By way of example, two reflectors 15' and two functional elements 40' are shown. In FIG. 14.*e*, functional elements 40' are again supplied by a common anode and a common cathode. In FIG. 14.*f*, by contrast, each functional element 40' has again associated therewith a separate anode and a separate cathode. As a special feature, two different ways of securing the contact pins 30' to the base body 10' are provided herein. The two inner contact pins 30' are fixed like the contact pins 30' illustrated in FIGS. 9.*a* to 9.*d*. The two outer contact pins 30' are fixed like the contact pins 30' illustrated in FIG. 8'.

It will be apparent to those skilled in the art that the described embodiments are to be understood as examples. The invention is not limited to these embodiments but may be varied in many ways without departing from the spirit of the invention. Features of individual embodiments and the features described in the general part of the specification may be combined among each other and with each other.

LIST OF REFERENCE NUMERALS

10 Base body
10*a* Upper surface of base body
10*b* Lower surface of base body
13 Lateral or circumferential surface of base body
14 Mounting area for a functional element
15 Insulation, or insulating layer
16 Sleeve or sheath
20 Glass layer or glass for joining and insulating
23 Insulation, or further glass layer
30 Connecting Body
40 Functional element, or LED, or FET
50 Connecting means, or wire, or bonding wire
60 End element, or optical component, or lens
61 Holder for end element
70 Head portion
71 Opening in head portion
100 Housing
10' Base body, or housing with channel formed therein and with connecting body mounted therein
10*a*' Upper surface of base body
10*b*' Lower surface of base body
10*c*' Lateral surface of base body
10*d*' Central axis of base body
11' Channel in or at base body
11-1' First portion or leg of the channel
11-2' Second portion or leg of the channel
12' Lateral channel or channel portion in the base body, or lateral recess in the base body
13' Non-lateral channel or channel portion in the base body, or non-lateral recess in the base body
14' Mounting area for functional element
15' Depression, or reflector in the base body
16' Accommodating area for an end element
17' Insulation, or insulating layer
20' Glass, or glass layer for joining and insulating
30' Connecting body, or contact pin
30*a*' First end face of connecting body
30*b*' Second end face of connecting body
30*c*' Lateral surface of connecting body
30-1' First portion of connecting body
30-2' Second portion of connecting body
35' Insulation, or glass layer
36' Sleeve or sheath
40' Optoelectronic functional element, or LED
50' Bonding wire, or wire
60' End element, or lens, or glass lens
61' Holder for end element

The invention claimed is:

1. A housing for accommodating an electronic functional element, comprising:
   a base body comprising an upper surface, a lower surface, and a lateral surface, the body having a boundary surface, wherein the boundary surface comprises copper oxide, and wherein the upper surface at least partially defines a mounting area for the electronic functional element so that said base body forms a heat sink for the electronic functional element;
   a connecting body made of metal;
   a glass layer that connects the base body to the connecting body so that the connecting body is electrically insulated from the base body,
   wherein the at least one glass layer is formed by an alkali titanium silicate glass having a composition in weight percent of $TiO_2$ greater than 25%.

2. The housing as claimed in claim 1, wherein the base body and the at least one connecting body comprise, at least at an interface to the glass layer, a material selected from the group consisting of copper, aluminum, austenitic steel, austenitic stainless steel, and combinations thereof, and wherein the alkali titanium silicate glass has a composition in weight percent of:

| | |
|---|---|
| $SiO_2$ | 20-50, |
| $TiO_2$ | >25-35, |
| $R_2O$ | 10-40, |
| $Al_2O_3$ | 0-5, |
| $CaO + SrO$ | 0-5, |
| $P_2O_5$ | 0-5, |
| $V_2O_5$ | 0-5, |
| $B_2O_3$ | 0-5, |
| $Sb_2O_3$ | 0-1, |
| $SnO_2$ | 0-5, |
| $Fe_2O_3$ | <1, |
| $CoO$ | <1, |
| $NiO$ | <1, |
| $ZnO$ | 0-4, |
| $ZrO_2$ | 0-4, |
| $F$ | 0-2, |
| $MoO_3$ | 0-1, |
| $N_2O_5$ | 0-6, |
| $SO_3$ | 0-1, and | wherein $R_2O$ comprises a sum of all alkali metal oxides.

3. The housing as claimed in claim 1, wherein the base body and the at least one connecting body comprise, at least at an interface to the glass layer, a material selected from the group consisting of copper, aluminum, austenitic steel, austenitic stainless steel, and combinations thereof, and wherein the alkali titanium silicate glass has a composition in weight percent of:

| | |
|---|---|
| SiO₂ | 36-40, |
| TiO₂ | >25-28, |
| Na₂O | 15-19, |
| K₂O | 10-14, |
| Li₂O | >0-3, |
| Al₂O₃ | 1-6, |
| CaO | >0-1, |
| SrO | <1, |
| P₂O₅ | >0-4, |
| B₂O₃ | >0-2, |
| Fe₂O₃ | 0-2, |
| CoO | <1, |
| NiO | <1, |
| ZnO | <1, and |
| ZrO₂ | <1. |

4. The housing as claimed in claim 3, wherein the composition in weight percent is:

| | |
|---|---|
| SiO₂ | 38, |
| TiO₂ | 26, |
| Na₂O | 17, |
| K₂O | 11.6, |
| Li₂O | 1.22, |
| Al₂O₃ | 3.7, |
| CaO | 0.3, |
| P₂O₅ | 1.6, |
| B₂O₃ | 0.29, |
| Fe₂O₃ | 0.08, |
| NiO | <0.02, and |
| ZrO₂ | 0.1. |

5. The housing as claimed in claim 1, wherein the at least one glass layer has a thickness of more than 30 μm.

6. The housing as claimed in claim 1, wherein the at least one glass layer has a thickness a range from 30 μm to 2000 μm.

7. The housing as claimed in claim 1, wherein the at least one glass layer is disposed in a location selected from the group consisting of between the lateral surface of the base body and the at least one connecting body, between the upper surface of the base body and the at least one connecting body, between the lower surface of the base body and the at least one connecting body, and combinations thereof.

8. The housing as claimed in claim 1, wherein at least portions of the at least one connecting body are arranged at a location selected from the group consisting of the upper surface of the base body, at the lower surface of the base body, and combinations thereof.

9. The housing as claimed in claim 8, wherein the at least one connecting body at least partially extends beyond the base body and forms at least one connection tab.

10. The housing as claimed in claim 1, wherein at least portions of the at least one connecting body is arranged at the lateral side of the base body and at least partially extends along the lateral surface of the base body.

11. A housing for accommodating an electronic functional element, comprising:
a base body comprising an upper surface, a lower surface, and a lateral surface, wherein the base body has a boundary surface, wherein the boundary surface comprises copper oxide, and wherein the upper surface at least partially defines a mounting area for the electronic functional element so that said base body forms a heat sink for the electronic functional element;
a connecting body made of metal; and
a glass layer that connects the base body to the connecting body so that the connecting body is electrically insulated from the base body; and
an insulation applied at least to the lower surface of the base body,
wherein the glass layer is formed by an alkali titanium silicate glass.

12. An electronic component comprising the housing as claimed in claim 1, further comprising a component arranged in the housing, the component being selected from the group consisting of: at least one radiation emitting optoelectronic functional element, at least one radiation receiving optoelectronic functional element, an LED, at least one power electronics device, a FET, and combinations thereof.

13. A housing for accommodating an electronic functional element, comprising:
a base body comprising an upper surface, a lower surface, a lateral surface, a boundary surface, and at least one channel, wherein the boundary surface comprises copper oxide, and wherein the upper surface at least partially defines a mounting area for the electronic functional element so that said base body forms a heat sink for the electronic functional element;
at least one connecting body made of metal arranged in the at least one channel; and
glass at least partially filling the at least one channel to join the base body to the at least one connecting body, so that the connecting body is electrically insulated from the base body, wherein the glass has a composition comprising, in weight percent, TiO₂ of greater than 25%.

14. The housing as claimed in claim 13, wherein the at least one channel is provided at a location on the base body selected from the group consisting of the lateral side, in an interior of the base body, and combinations thereof.

15. The housing as claimed in claim 13, wherein the at least one channel is formed as a recess selected from the group consisting of a lateral recess in the base body, a non-lateral recess in the base body, and combinations thereof.

16. The housing as claimed in claim 13, wherein the at least one channel opens to a location selected from the group consisting of the upper surface, the lower surface, the lateral surface, and combinations thereof.

17. The housing as claimed in claim 13, wherein the at least one channel comprises a rectilinear first portion that extends along a central axis of the base body.

18. The housing as claimed in claim 17, wherein the rectilinear first portion of the channel is provided as an opening in the base body.

19. The housing as claimed in claim 17, wherein the at least one channel further comprises a rectilinear second portion that extends substantially transversely to the first portion, and wherein the first portion merges into the second portion.

20. The housing as claimed in claim 19, wherein the second portion is provided as a recess in a surface of the base body selected from the group consisting of the upper surface, the lower surface, and combinations thereof.

21. The housing as claimed in claim 19, wherein the second portion extends from the central axis towards the lateral surface.

22. The housing as claimed in claim 13, wherein the connecting body is a contact pin.

23. The housing as claimed in claim 13, wherein the glass is an alkali titanium silicate glass.

24. The housing as claimed in claim 13, wherein at least the upper surface of the base body has a depression with a bottom, and the mounting area for the optoelectronic functional element is provided by the bottom of the depression.

25. The housing as claimed in claim 24, wherein the at least one channel opens into a lateral surface of the depression.

26. The housing as claimed in claim 13, further comprising a component selected from the group consisting of an insulation at least partially covering the lower surface of the base body, a sleeve disposed at the lateral side of the base body that at least partially extends around a circumferential surface of the base body, and combinations thereof.

27. The housing as claimed in claim 1, wherein the base body and the at least one connecting body comprise, at least at an interface to the glass layer, a material selected from the group consisting of copper, aluminum, and combinations thereof.

28. The housing as claimed in claim 27, wherein the material comprises copper of at least 50 wt. %.

29. The housing as claimed in claim 27, wherein the material comprises copper of at least 80 wt. %.

30. The housing as claimed in claim 27, wherein the material comprises an oxide weight in mass per unit area from 0.02 to 0.25 mg/cm$^2$.

31. The housing as claimed in claim 27, wherein the material comprises an oxide weight in mass per unit area from 0.067 to 0.13 mg/cm$^2$.

32. The housing as claimed in claim 11, further comprising a sleeve disposed at the lateral side of the base body that at least partially extends around a circumferential surface of the base body.

\* \* \* \* \*